(12) United States Patent
Taussig et al.

(10) Patent No.: US 7,795,062 B2
(45) Date of Patent: Sep. 14, 2010

(54) METHOD OF FORMING A PRESSURE SWITCH THIN FILM DEVICE

(75) Inventors: Carl P. Taussig, Palo Alto, CA (US); Ping Mei, Palo Alto, CA (US); Hao Luo, Palo Alto, CA (US); Warren Jackson, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 339 days.

(21) Appl. No.: 11/696,079

(22) Filed: Apr. 3, 2007

(65) Prior Publication Data
US 2008/0248605 A1    Oct. 9, 2008

(51) Int. Cl.
*H01L 21/00* (2006.01)

(52) U.S. Cl. .................... 438/53; 438/455; 257/415; 257/E29.324

(58) Field of Classification Search ............ 438/739, 438/149, 53; 200/512
See application file for complete search history.

(56) References Cited

U.S. PATENT DOCUMENTS

| | | | | |
|---|---|---|---|---|
| 4,302,647 A | * | 11/1981 | Kandler et al. .......... | 200/512 |
| 6,808,646 B1 | * | 10/2004 | Jeans ..................... | 216/54 |
| 6,861,365 B2 | | 3/2005 | Taussig et al. | |
| 2004/0217085 A1 | | 11/2004 | Jeans | |
| 2006/0134922 A1 | * | 6/2006 | Taussig et al. ............ | 438/739 |

* cited by examiner

*Primary Examiner*—Thao X Le
*Assistant Examiner*—Mark A Laurenzi, III

(57) ABSTRACT

This invention provides a method of forming at least one pressure switch thin film device. The method includes providing a substrate and depositing a plurality of thin film device layers as a stack upon the substrate. An imprinted 3D template structure is provided upon the plurality of thin film device layers. The plurality of thin film device layers and the 3D template structure are then etched and at least one thin film device layer is undercut to provide a plurality of aligned electrical contact pairs and adjacent spacer posts. A flexible membrane providing a plurality of separate electrical contacts is deposited upon the spacer posts, the separate electrical contacts overlapping the contact pairs. The spacer posts provide a gap between the electrical contacts and the contact pairs.

20 Claims, 19 Drawing Sheets

FIG. 19
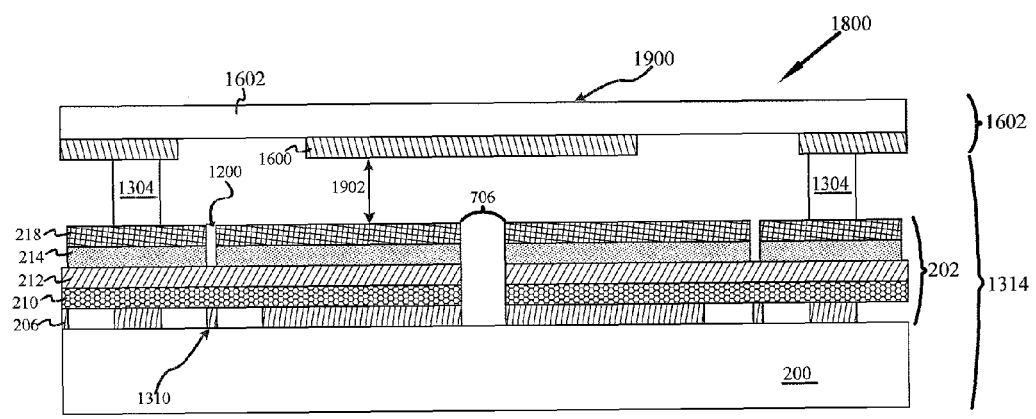
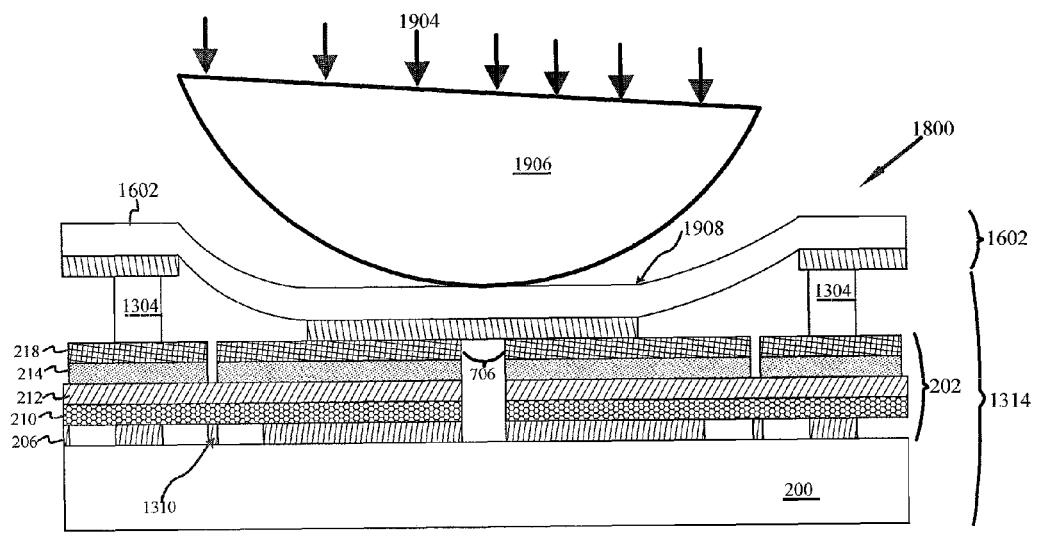

FIG. 20
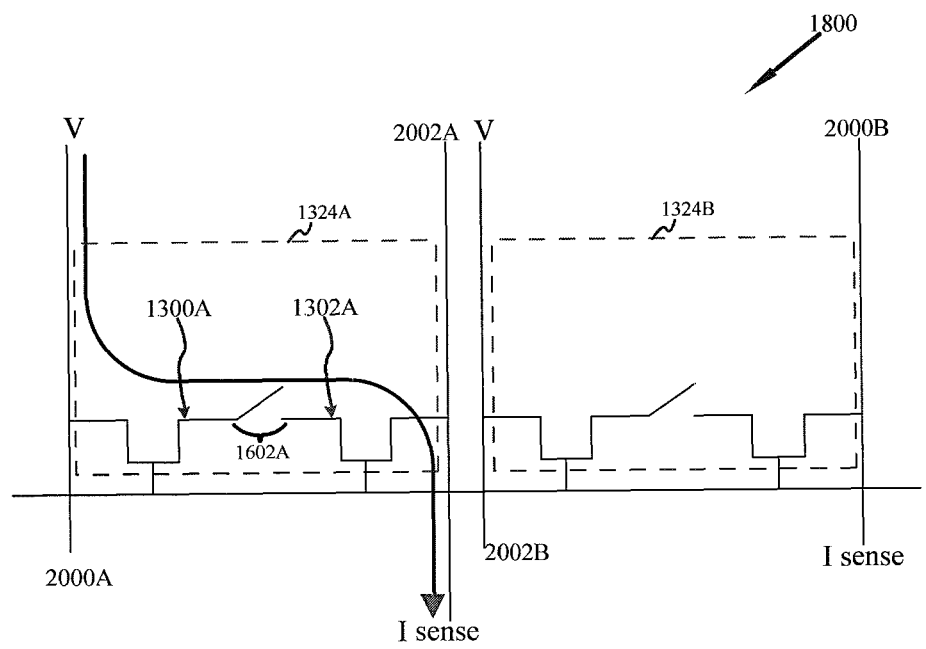
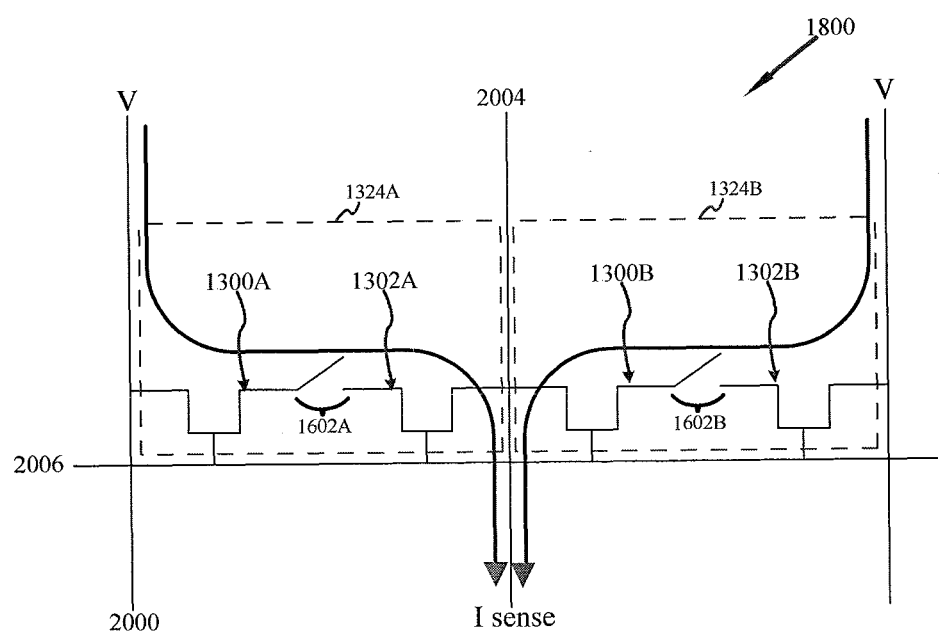

METHOD OF FORMING A PRESSURE SWITCH THIN FILM DEVICE

FIELD OF THE INVENTION

The present invention relates generally to the field of forming semiconductor devices, and in particular to an improved method of making at least one pressure switch thin film device.

BACKGROUND

Socially and professionally, identification of an individual is an issue of growing importance. Passwords are commonly used, but can be shared and such sharing immediately defeats assurance of true personal identification.

Greater assurance of proper identification can be achieved with biometric verification. Voice print analysis, breath and retinal scanning have been recognized as effective means of identification, but each typically requires specialized equipment and backend processing. Fingerprint analysis has also proven to be an effective means of personal identification.

The fingerprint is comprised of a series of ridges and valleys of epidural tissue. It has been known for years that applying ink to a fingers permits an impression to be made that visually displays these ridges and valleys and permits individual identification. This impression is of course achieved because the ridges apply pressure to the paper and therefore transfer the applied ink, whereas the valleys apply no pressure and thus transfer little if any ink.

The presence of ridges and valleys in the finger print has permitted various systems to be devised that attempt to detect and recognize these same pressure point patterns in electronic form. Some of these include optical detection and others involve capacitance, and still others may employ physical pressure sensors. Indeed many computer systems now present the user with a sensor strip over which a user may drag his or her finger as a method of identification.

With respect to sensors employing physical pressure detecting devices, these are typically based on a cross point network. At each cross point there is a pressure activated contact and a resister in series. The matrix is implemented in a clam shell design. More specifically there are two substrates and each has a set of parallel features spaced about 50μ apart. On one substrate there is a stack of three thin films: a bottom layer of gold, a doped amorphous silicon layer which serves as the resister; and a second gold layer that makes up half of the mechanical contact. On this substrate all three layers are first patterned into lines and the top metal contact layer is then segmented into rectangles spaced at 50μ pitch to define individual elements at each crosspoint.

The silicon layer may be co-patterned with the top metal if its lateral conduction is significant relative to its conduction through the film. The second substrate has a set of parallel metal lines on it. The substrates are assembled with the patterned films facing each other. The parallel features on each substrate must be properly aligned so that they are orthogonal with respect to those on the other substrate.

The substrates are assembled so that the metal contacts on top of the silicon films are aligned with the metal traces on the opposing film. The substrates are held apart by some form of spacer that must also be aligned and positioned so as not to prevent contact between the metal contacts on top of the silicon films and the metal traces. A typical fingertip sensor contains 256 rows and 256 columns resulting in a sensor of approximately 13×13 mm.

When a finger is pressed down on the sensor, the substrates are forced together under the ridges closing the electrical contacts at those locations in the cross point array. Between the ridges no electrical contact is made. The pitch of the ridges on the fingertip is approximately 400μ.

The detection of a single open or closed switch in such a crosspoint resister array is a difficult problem. If all the switches are closed and voltage is applied to one row and one column, then in addition to the current that is flowing through the switch at the selected row and column, there will be additional currents flowing through all the unselected row and column resisters to ground. The 'sneak path current' is equal to 510 1MΩ resistors (the non-selected resistors on the selected row and column) in parallel through half the voltage drop or 255 resistors in parallel through the whole voltage drop.

This problem is not substantially changed if the unselected lines are left floating instead of being grounded. The detection problem is equivalent to detecting the difference between 255 and 256 resistors in parallel. Because these resistors ate vertical thin film resistors their resistance is hard to control and the variability will further complicate the detection problem. This detection can be made easier if the common mode signal (sneak path current) can be turned off, however this is difficult because it is data (fingerprint) dependent and will take time to isolate. Readout is also slow as it is made one pixel at a time.

Moreover, large crosstalk in the device makes detection difficult. In addition, the use of gold is expensive and the issue of precise alignment makes fabrication difficult. In the event of a short, the short will kill the row and column that it is located on. Multiple shorts will quickly result in a non-viable crosspoint array.

Due to the these technical issues, it is often more common to see applications of a sensor strip across which the fingertip is swiped. As the swipe sensor is narrower in at least one dimension it is lower in cost and it lessens some of the above issues, though they still remain.

With respect to the fabrication of the substrates, each is fabricated through traditional photolithography. In a photolithographic process, a substrate is provided and at least one material layer is uniformly deposited upon the substrate. A photo-resist layer, also commonly known simply as a photo-resist, or even resist, is deposited upon the material layer, typically by a spin coating machine. A mask is then placed over the photo resist and light, typically ultra-violet (UV) light, is applied. During the process of exposure, the photo-resist undergoes a chemical reaction. Generally the photoresist will react in one of two ways.

With a positive photoresist, UV light changes the chemical structure of the photoresist so that it is soluble in a developer. What "shows" therefore goes, and the mask provides an exact copy of the patterns which are to remain—such as, for example, the trace lines of a circuit.

A negative photoresist behaves in the opposite manner—the UV exposure causes it to polymerize and not dissolve in the presence of a developer. As such the mask is a photographic negative of the pattern to be left. Following the developing with either a negative or positive photoresist, blocks of photoresist remain. These blocks may be used to protect portions of the original material layer, serve as isolators or other components.

Very commonly, these blocks serve as templates during an etching process, wherein the exposed portions of the material layer are removed, such as, for example, to establish a plurality of conductive rows.

The process may be repeated several times to provide the desired thin film devices. As such, new material layers are set down on layers that have undergone processing. Such processing may inadvertently leave surface defects in the prior layers as well as unintended contaminant particles.

The crystalline texture of the materials composing each material layer, and specifically the crystalline texture of each material at an interface between materials is often of significant importance to the operation of the thin film device. Surface defects and surface contaminants may negatively affect the interfaces between layers and possibly degrade the performance of the thin film device.

In addition, photolithography is a precise process applied to small substrates. In part this is due to the high cost of the photo masks. For the fabrication of larger devices, typically rather than employing a larger and even more costly photo mask, a smaller mask is repeatedly used—a process that requires precise alignment.

As a photolithographic process typically involves multiple applications of materials, repeated masking and etching, issues of alignment between the thin film layers is of high importance. A photolithographic process is not well suited for formation of thin film devices on flexible substrates, where expansion, contraction or compression of the substrate may result in significant misalignment between material layers, thereby leading to inoperable thin film devices. In addition a flexible substrate is not flat—it is difficult to hold flat during the imprinting and/or exposure process, and thickness and surface roughness typically can not be controlled as well as they can for glass or other non-flexible substrates.

The issue of flatness in photolithography can be a problem because the minimum feature size that can be produced by a given imaging system is proportional to the wavelength of the illumination divided by the numerical aperture of the imaging system. However the depth of field of the imaging system is proportional to the wavelength of the illumination divided by the square of the numerical aperture. Therefore, as resolution is increased the flatness of the substrate quickly becomes the critical issue.

These issues of fabrication are of concern in the fabrication of a fingerprint sensor and typically limit the size of such a device to the 256 by 256 pixel device noted above. As applications may well exist where a larger device would be well suited, multiple small devices must be combined, each of which enjoys the same problems and limitations in performance and fabrication as noted above.

Hence, there is a need for a process to provide at least one pressure sensor thin film device that overcomes one or more of the drawbacks identified above.

SUMMARY

The present disclosure advances the art by providing a method of forming at least one pressure sensor thin film device.

In particular and by way of example only, according to an embodiment of the present invention, a method of forming a pressure switch thin film device including: providing a substrate; depositing a plurality of thin film device layers upon the substrate; providing a 3D template structure upon the plurality of thin film device layers, the 3D template providing all patterning and alignment for all subsequent etching and undercutting; etching the plurality of thin film device layers and 3D template structure to define a plurality of aligned electrical contact pairs and adjacent spacer posts; undercutting at least one thin film device layer to provide an active matrix; depositing a flexible membrane upon the active matrix, the membrane providing a plurality of separate electrical contacts overlapping the contact pairs, the spacer posts providing a gap between the electrical contacts and the contact pairs.

In yet another embodiment, provided is a pressure switch thin film device including: a first substrate; at least one paired set of bottom gate thin film transistors upon the first substrate as an active matrix, each paired set of transistors providing electrical contact pairs adjacent to inherently aligned spacer posts extending above the electrical contact pairs, opposite from the first substrate, each electrical contact pair separated by a physical gap having a depth, a length and a width, each electrical contact having a first dimension parallel to the length; and a second flexible substrate providing a plurality of separate electrical contacts disposed upon the spacer posts, each separate electrical contact upon the second flexible substrate having a width dimension greater than the gap width and a length dimension less than the electrical contact length, the separate electrical contacts staggered in arrangement upon the second flexible substrate; and the spacer posts providing a physical gap between the electrical contact pairs and the separate electrical contacts.

BRIEF DESCRIPTION OF THE DRAWINGS

FIG. 19 is a side view cut through of a portion of the pressure switch thin film device as shown in FIG. 18 further illustrating the flexible properties of the structure shown in FIG. 16 in accordance with an embodiment; and FIG. 20 presents at least two circuit designs incorporating the pressure switch thin film device shown in FIG. 18 according to at least two embodiments.

DETAILED DESCRIPTION

Figure 1:
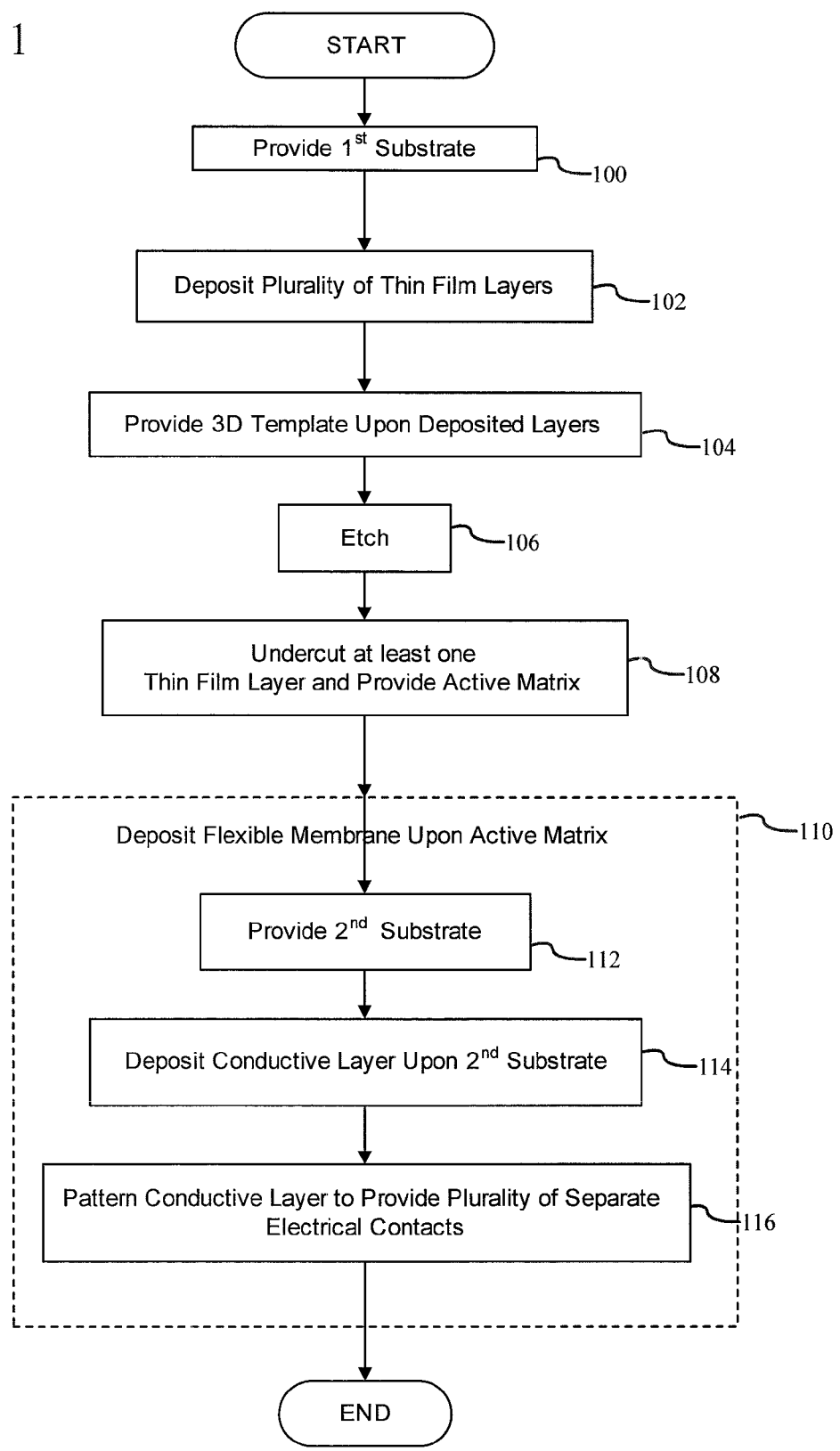
FIG. 1 is a high level flowchart of at least one method embodiment.

Before proceeding with the detailed description, it is to be appreciated that the present teaching is by way of example, not by limitation. Thus, although the instrumentalities described herein are for the convenience of explanation shown and described with respect to exemplary embodiments, it will be appreciated that the principles herein may be equally applied in other types of pressure switch thin film devices.

In at least one embodiment, the method for forming at least one pressure sensor-thin film device incorporates Self-Aligned Imprint Lithography ("SAIL"), a recently developed technique for producing multilayer patterns on flexible substrates. The basics of this process are set forth and described in U.S. Pat. No. 6,861,365 entitled "Method and System for Forming a Semiconductor Device" which is incorporated herein by reference.

In addition, in at least one embodiment, the method of forming at least one pressure sensor thin film device further incorporates a SAIL undercutting method, the basics of which are set forth and described in U.S. patent application Ser. No. 11/025,750, published as 2006/0134922A1, the disclosure of which is incorporated herein by reference.

The SAIL technique uses a 3D patterned resist and is typically employed with a roll-to-roll process. As the 3D resist is flexible, the pattern will stretch or distort to the same degree as the substrate. As such, a SAIL roll-to-roll fabrication process may be employed to provide low cost manufacturing solutions for devices such as flat and/or flexible displays, or other devices suitable for roll-to-roll processing. It shall also be realized that the disclosed method may be employed upon a non-flexible substrate while remaining within the spirit and scope of at least one embodiment.

Referring now to the drawings, the flow diagram of FIG. 1 in connection with FIGS. 2~19 conceptually illustrates at least one embodiment of a method of forming at least one pressure sensor thin film device (hereinafter "TFD"). It will be appreciated that the described process need not be performed in the order in which it is herein described, but that this description is merely exemplary of one preferred method of fabricating at least one TFD. In addition, it is understood and appreciated that the scale of the components and features illustrated in the Figures has been exaggerated to facilitate ease of discussion.

FIG. 1 is a high level flowchart of a method for forming at least one TFD. As indicated in block 100, the processes are generally commenced by providing a flexible substrate. A plurality of thin film device layers are then deposited upon the substrate, block 102. An imprinted 3D template structure, such as an imprinted polymer, is then provided upon the plurality of thin film device layers, block 104.

The plurality of thin film device layers and the 3D template structure are then etched, block 106. This etching forms the rudimentary structure for a the thin film device and more specifically a plurality of aligned electrical contact pairs and adjacent spacer posts.

The rudimentary structure is further transformed into an active matrix by undercutting at least one thin film device layer, block 108. As is further explained below, it is to be appreciated that under the present method, a planarizing material is not employed. More specifically, all thin film device layers are advantageously deposited before etching is performed, and subsequent planarization steps and the deposition of further material layers are not required to achieve a TFD.

A flexible membrane having a plurality of separate electrical contacts is the disposed upon the active matrix, block 110. In at least one embodiment, the flexible membrane is established by providing a second flexible substrate, block 112. At least one conductive layer is then deposited upon the second flexible substrate, block 114. This conductive layer is then patterned to define the plurality of separate electrical contacts, block 116.

Figure 2:
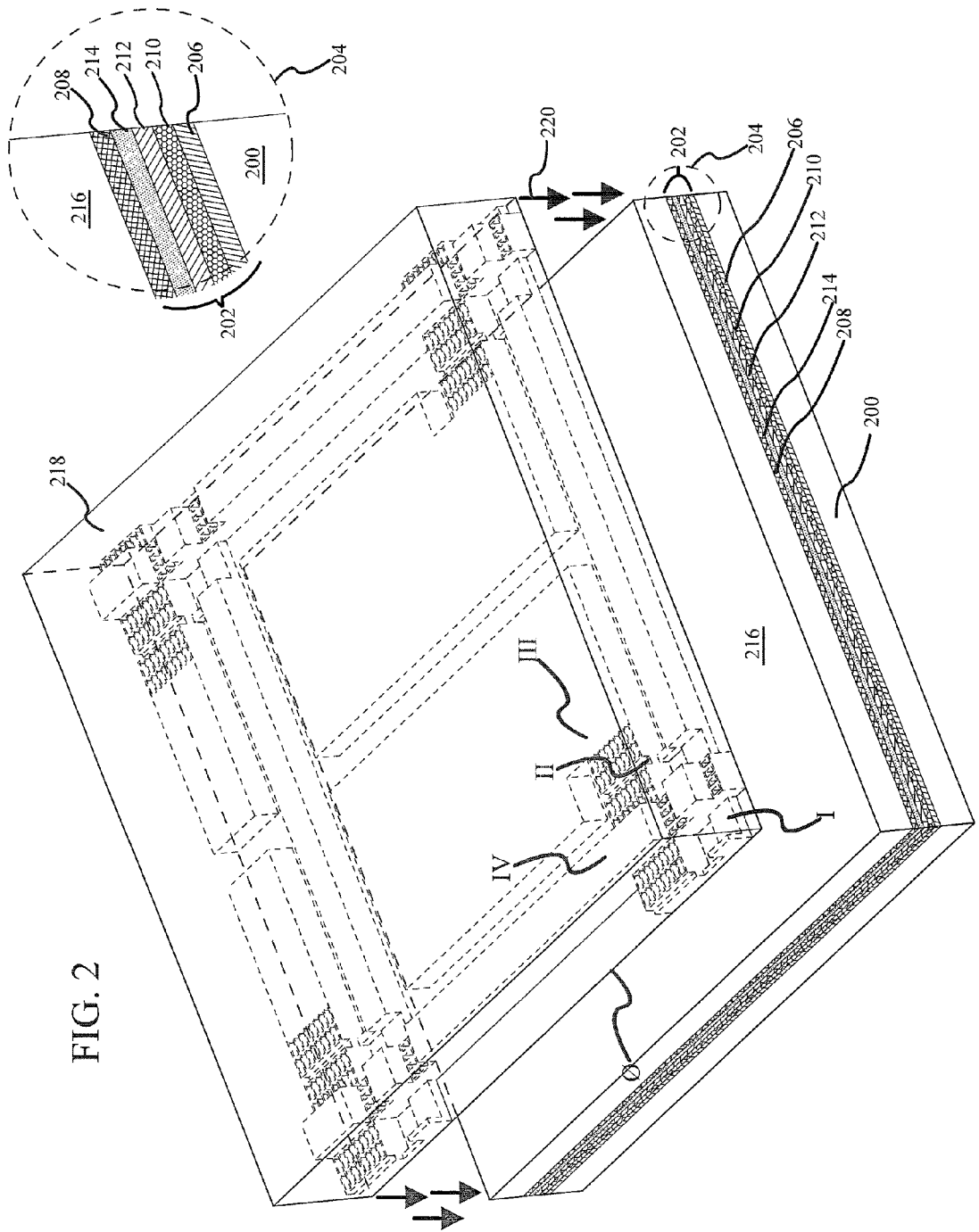
FIG. 2 is a perspective view of a substrate with a plurality of thin film layers and polymer set to receive a stamping template in accordance with an embodiment.

Turning to FIG. 2, provided is a more detailed illustration of the initial processes described above. Specifically there is shown a portion of a substrate 200. Typically, the substrate 200 is chemically cleaned to remove any particulate matter, organic, ionic, and or metallic impurities or debris which may be present upon the surface of the substrate 200. A plurality of thin film layers 202 are deposited upon the substrate 200 as a stack, the stack having a top layer and a bottom layer. Moreover, thin film layers 202 may be collectively referred to as thin film stack 202.

An area indicated by dotted circle 204 is enlarged to more clearly show the plurality of thin film layers 202. In at least one embodiment, the plurality of thin film layers 202 include a first metal layer 206 and a second metal layer 208 with at least one material layer there between. As shown, the first metal layer 206 is the bottom layer and the second metal layer 208 is the top layer. As will be further explained below, the composition of the first metal layer 206 is different from the composition of the second metal layer 208.

In at least one example first metal layer 206 and second metal layer are selected from the group of chromium, molybdenum chromium, aluminum, titanium tungsten, and or combinations thereof. These two layers (206, 208) can be also made by other conductive materials such as indium tin oxide. Further, dielectric layer 210 can be selected from the group of silicon nitride, silicon oxide, aluminum oxide, and or combinations thereof. Further still, semiconductor layer 214 can be selected from the group of amorphous or micro-crystalline Si, zinc oxide, and or combinations thereof.

In at least one embodiment the pressure switch thin film device utilizes matched pairs of transistors. As such, for the purposes of discussion herein, the illustrated layers between the first metal layer 206 and the second metal layer 208 are a dielectric layer 210, a channel semiconductor 212, and a contact layer 214. Moreover, it is appreciated that the matched pairs of transistors to be formed from thin film layers 202 are bottom gate transistors.

With respect to transistors, there are two types—bottom-gate transistors and top gate transistors. Bottom-gate transistors incorporating amorphous silicon are generally more desirable then top gate amorphous silicon transistors. This is due in part to better device performance in terms of a higher electron field effect mobility and a lower off-state leakage current. For purposes of discussion, the fabrication of a bottom-gate thin film transistor (TFT) will be used as an example. It is, of course, understood and appreciated that the undercutting method herein described is not limited to the fabrication of bottom-gate TFT's, but may be employed in a variety of different fabrication settings.

In at least one embodiment substrate 200 is a flexible substrate, such as, for example, a polyimide plastic sheet with or without an inorganic coating. In at least one alternative embodiment, substrate 200 is transparent. Further substrate 200 may be both transparent and flexible. In addition, in at least one embodiment, the plurality of thin film layers 202 is a stack of Aluminum, Silicon Nitride, Amorphous Silicon, N+ doped microcrystalline or amorphous Silicon, and Titanium. In an alternative embodiment, the plurality of thin film layers 202 is a stack of Titanium, Alumina, Zinc Oxide, and Aluminum.

Deposition of the thin film layers 202 may be done by vacuum deposition, gravure coating, or such other method as is appropriate for the material being deposited and/or the TFD being formed. As each of the thin film layers 202 is deposited directly upon the other and without intervening processing steps, such as but not limited to, masking, etching, and planarizing, the interfaces between each of the thin film layers 202 may be of high quality.

Typically, when one material layer is deposited upon another, the morphology surface roughness and surface chemistry of the base layer will affect the development of the structure within the deposited layer. The propagation of a desirable thin film structure is often desired to establish high quality interfaces, and ultimately the operational characteristics of the TFD. The deposition of all thin film layers 202 prior to further processing may advantageously permit the formation of TFDs with highly uniform and/or superior operational properties.

To provide a template for forming at least one TFD, it is desirable to have a 3D template structure over the stacked thin film layers 202. In at least one embodiment, a polymer 216, such as an imprint polymer or imprint resist, is deposited upon the stacked thin film layers 202 and imprinted by a stamping tool 218. The resist or polymer 216 may comprise any of a variety of commercially available polymers. For example, a polymer from the Norland optical adhesives (NOA) family of polymers could be used. A silicone material may also be used as is described in patent application Ser. No. 10/641,213 entitled "A Silicone Elastomer Material for High-Resolution Lithography" which is herein incorporated by reference.

As will be further discussed below, portions of the polymer 216 will ultimately provide spacer posts 1304 (see FIG. 13) between components of the pressure switch thin film device. As such, in at least one embodiment, polymer 216 is selected to be a non-conductive material.

The stamp 218, though shown as a block, is in at least one embodiment provided by a stamping roller. In at least one embodiment this is a seamless imprinting roller as set forth and described in U.S. patent application Ser. No. 11/688,086 filed on Mar. 19, 2007 and entitled "Seamless Imprint Roller And Method of Making," which is herein incorporated by reference. With further respect to roll-to-roll processing where substrate 200 may be of arbitrary size, yet another method for providing a 3D Structure is described in U.S. Pat. No. 6,808,646 entitled "Method of Replicating a High Resolution Three-Dimension Imprint Pattern on a Compliant Media of Arbitrary Size" which is also herein incorporated by reference.

For the formation of a TFD such as a pressure switch thin film device 1800 (see FIG. 18), stamping tool 218 as shown has an imprinting pattern with five (5) different vertical elevations—the first, elevation Ø corresponding to the base of the stamping tool 218, and elevations I, II, III and IV extending inwardly from elevation Ø.

As illustrated by arrows 220, stamping tool 218 is brought into intimate contact with polymer 216 with sufficient force to imprint polymer 216 and establish a 3D template structure. In at least one embodiment, capillary forces are used to draw the imprint polymer 216 into the stamping tool 218, thus permitting very low contact pressure. Stamping tool 218 may be translucent such that the stamped polymer may be hardened or otherwise cured, such as by UV light, to retain the 3D template structure.

Figure 3:
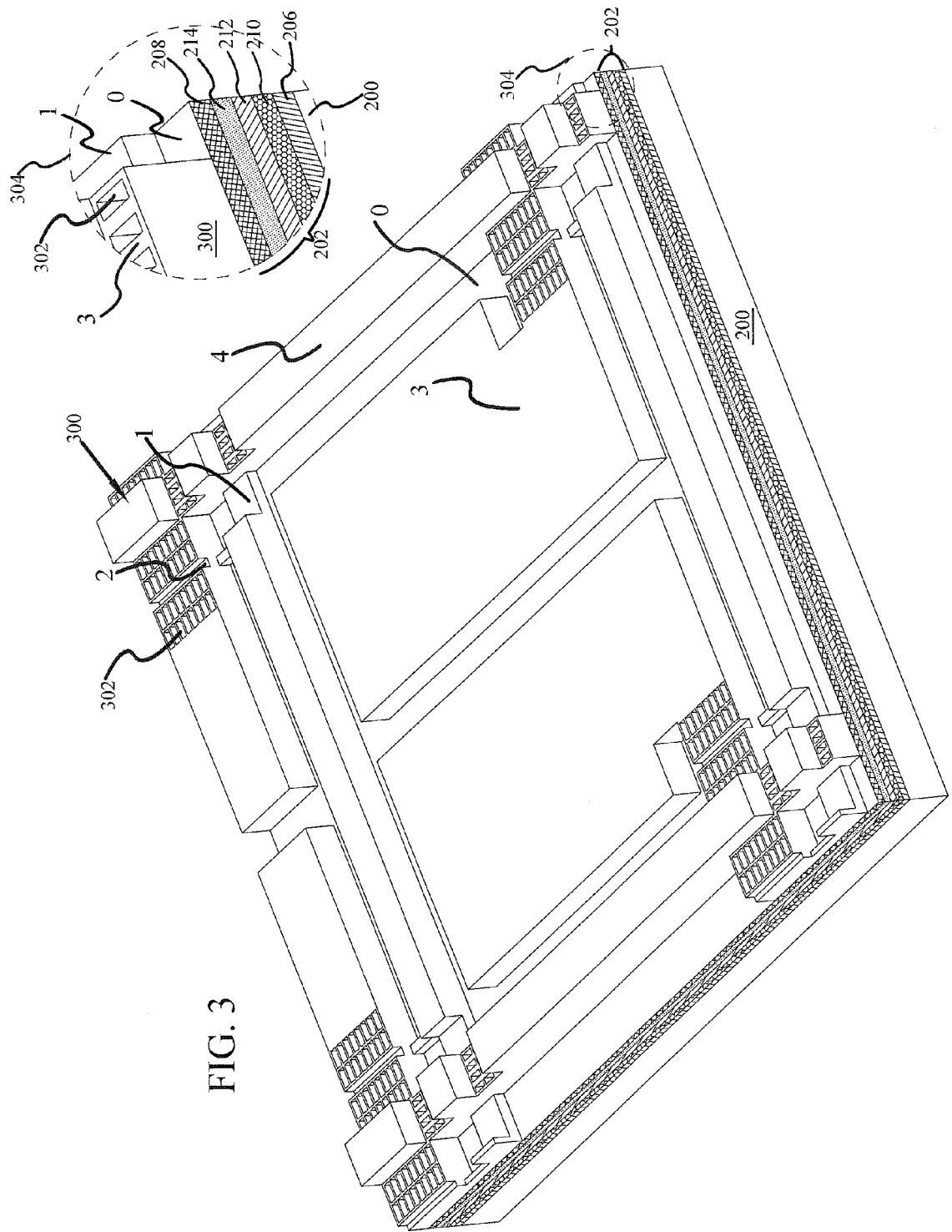
FIG. 3 is a perspective view of the formed 3D polymer template in accordance with an embodiment.

FIG. 3 illustrates the resulting 3D template structure 300. 3D template structure 300 has a plurality of different levels, also know as vertical heights. Ideally, after the imprinting process there is no polymer material in areas corresponding to stamping tool 218 elevation Ø, however due to squeeze film effects, a thin residual film of polymer may be present. This thin residual film is generally on the order of 100 nm. As indicated above, the scale in the illustrations has been exaggerated.

As shown, each of the thin film layers 202 is substantially the same thickness, an arbitrary one unit. In actuality, each layer may vary in thickness. For example, typical thickness for amorphous Si as semiconductor 212 and doped Si as contact layer 214 are 100 nm and 20 nm, respectively. Further, each layer may in actuality consist of multiple layers due to the method of deposition selected. In addition, although the 3D template structure 300 is shown to be four arbitrary units high, the step heights in an actual polymer mask are about ten times the thickness of the thin film layers (202), i.e., 1μ versus 0.1μ.

This residual film represents 3D template structure 300 mask level 0. 3D template structure 300 mask level 1 covers the region of thin film layers 202 that will ultimately form gate lines. 3D template structure 300 mask level 2 covers the region of thin film layers 202 that will ultimately form the channel region. 3D template structure 300 mask level 3 covers the region of thin film layers 202 that will ultimately form the source and drain contacts. 3D template structure 300 mask level 4 covers areas of the 3D template structure 300 that will provide spacer posts inherently aligned to the source and drain contacts.

In at least one embodiment, the polymer material present at mask level 0 is used to provide electrical isolation between features and to provide an entry area for the undercut permitted by feature 302 discussed below. The material providing levels 1, 2, 3 and 4 are the primary vertical heights used to template the formation of the pressure switch thin film device. The difference in heights between each of the primary vertical heights (1, 2, 3 and 4) is on the order of 1μ and may be different for different levels.

In a properly functioning transistor, capacitive coupling between the gate metal and the source and drain metal is minimized. 3D template structure 300 provides at least one feature 302 that is used to promote this isolation. As shown, a plurality of features 302 are grouped together in different areas to promote this isolation. An enlarged section bounded by dotted line 304 is also provided to further show the thin film layers 202 once again and a portion of the 3D template 300.

Figure 4:
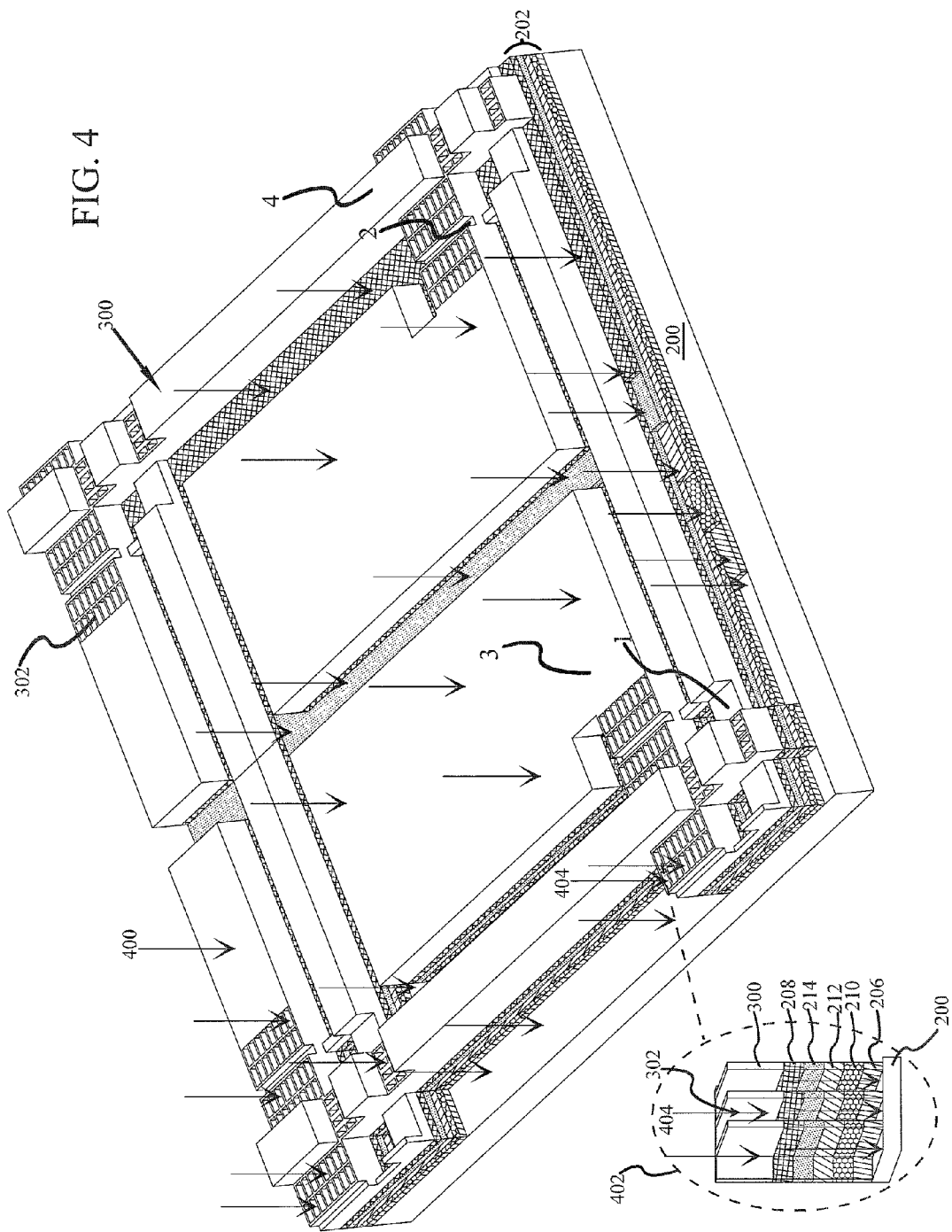
FIG. 4, is a perspective view of structure in FIG. 3 undergoing etching in accordance with an embodiment.

FIG. 4 illustrates the process of etching, specifically ion etching. This etching process may involve a series of etches, first to remove any residual polymer at level 0, then second metal layer 208, contact layer 214, semiconductor layer 212, dielectric layer 210, and first metal layer 206. Preferably, in at least one embodiment these etches are substantially anisotropic, as illustrated by arrows 400 being substantially perpendicular to substrate 200.

Features 302 in 3D template structure 300 permit the etching process to be performed on specifically localized sections of the thin film layers 202 that are otherwise covered by 3D template structure. As may be more fully appreciated in partial enlarged cutaway bounded by dotted oval 402, the anisotropic etching 400 removes material from thin film layers 202 so as to create a hollow below feature 302.

These etches are mutually selective. Further, it is understood that generally a layer is completely removed before etching on the layer beneath is commenced. The condensed stair step depiction of removal shown in FIG. 4 is intended as a composite image demonstrating multiple etching steps.

As noted above, traditional lithographic processes such as photolithography involve the steps of deposition of a layer, 2D masking, etching, and repetition of these actions in order to achieve the desired thin film device or other structure. As masking, etching and layering are performed again and again, alignment throughout the process is highly critical and substrate distortion will likely undermine the functionality of the intended device.

Figure 5:
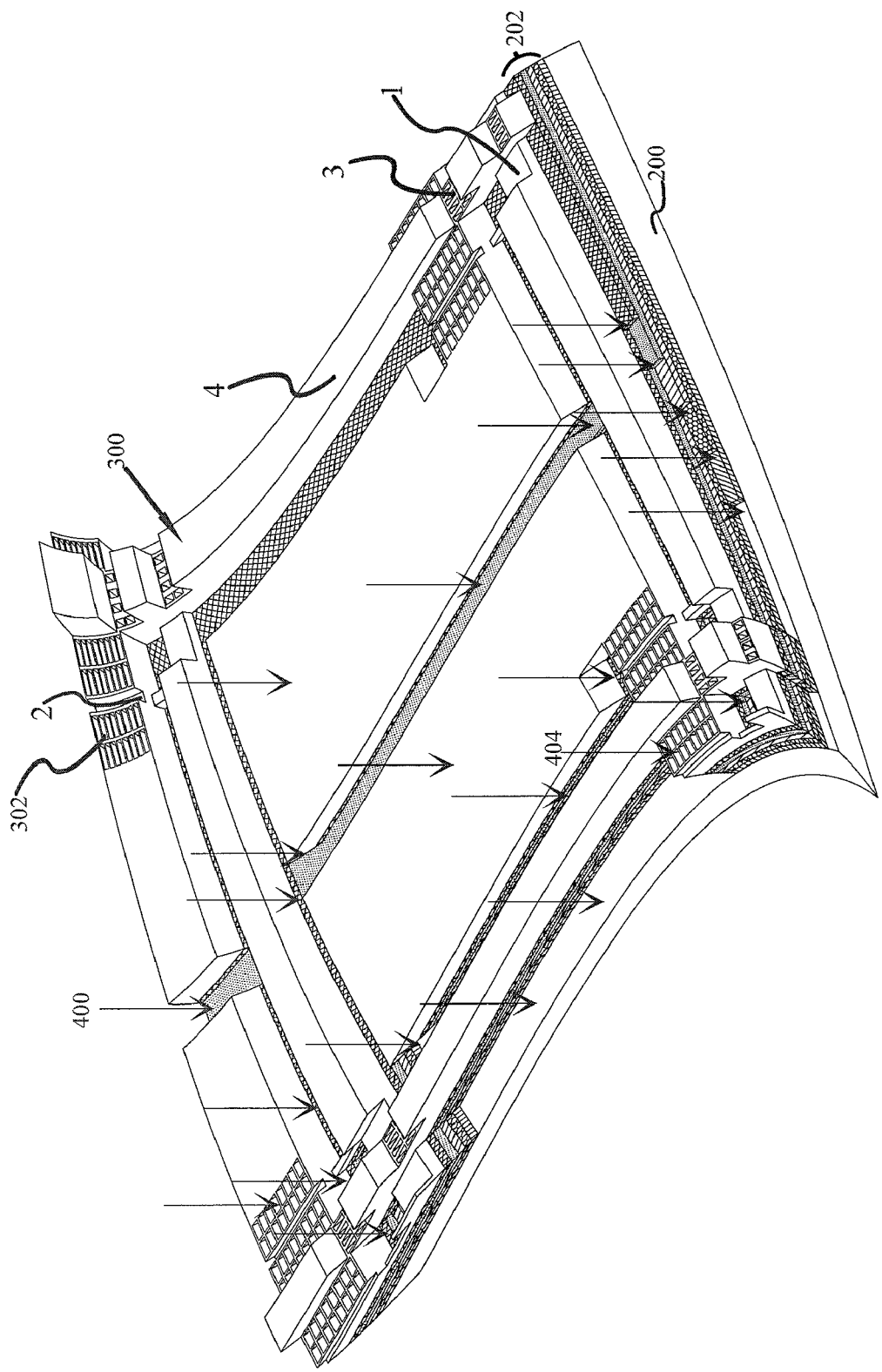
FIG. 5, is a perspective view of structure in FIG. 3 undergoing etching in and further demonstrating the maintained alignment between the 3D template and thin film layers even during structural distortion.

FIG. 5 illustrates the highly advantageous nature of the SAIL process to effectively provide alignment with respect to each level of the 3D template 300, the thin film layer 202 and the substrate 200 without respect to distortion. Moreover, once the 3D template is established the alignment of all features, including the spacer posts is inherently established and remains so throughout the fabrication process and into the final device regardless of any distortion.

Figure 6:
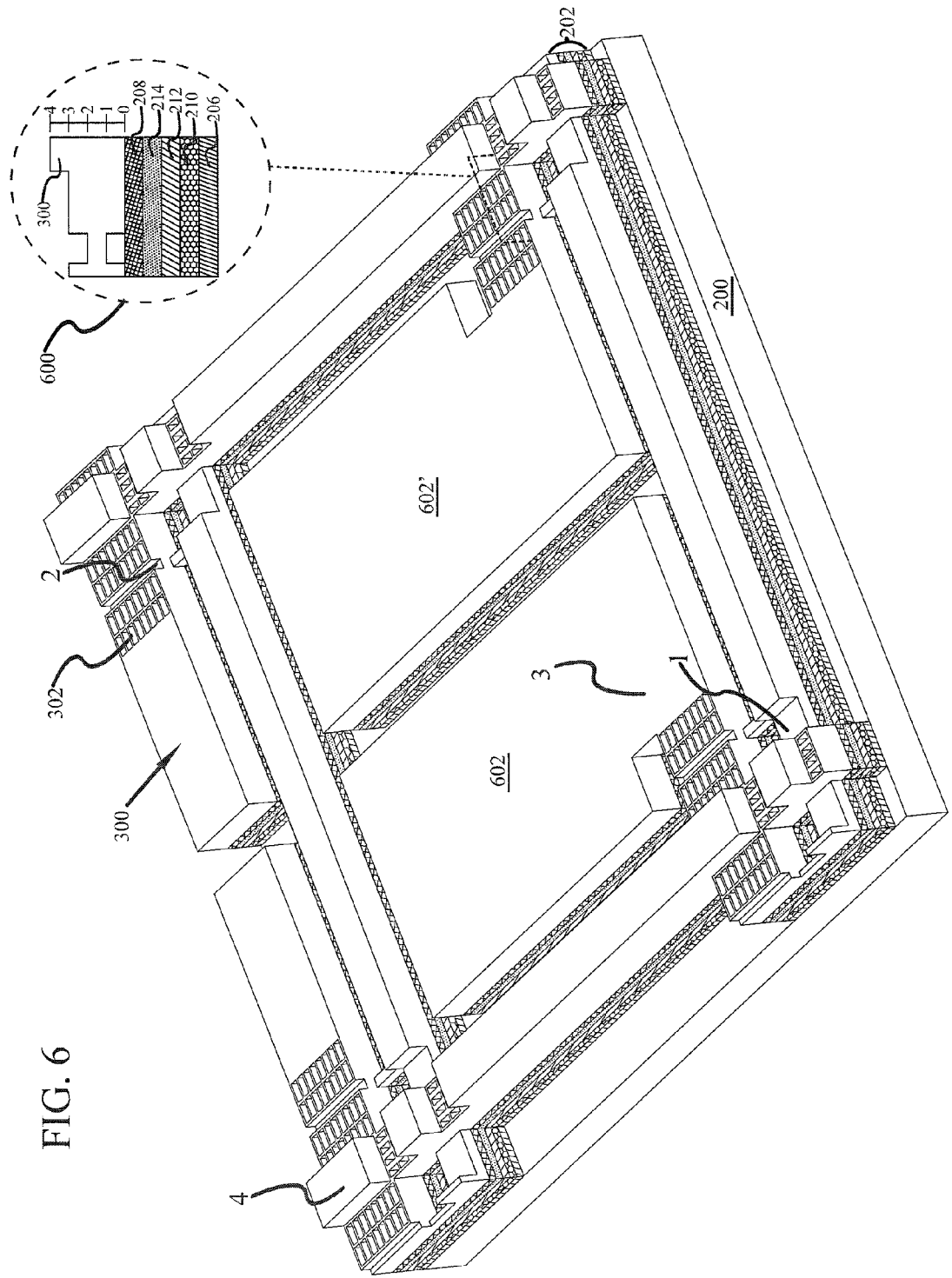
FIG. 6 is a perspective view of the resulting structure in FIG. 4 having been etched down to the substrate and undercut in accordance with an embodiment.

FIG. 6 illustrates the status of the forming pressure switch thin film device with the unmasked portions of the thin film layers 202 removed. As shown by arrows 404 (FIG. 4), the etching process is applied through features 302 of 3D template structure 300 as well. A cross section view bounded by dotted line 600 (FIG. 6) illustrates a portion of the structure and further illustrates the relative heights (0, 1, 2, 3, 4) of the 3D template structure 300.

It is generally understood that an ion etching process may be accomplished by either of two traditional processes—a physical process or an assisted physical process. In a physical etching environment, no chemical agent is provided. Rather, the removal of material is entirely dependent upon the physical impact of the ions knocking atoms off the material surface by physical force alone. Physical ion etching is commonly referred to as ion milling or ion beam etching. Physical ion etching is also typically referred to as a dry process. A physical etching process is typically very anisotropic.

In an assisted physical process such as a reactive ion etching process, or RIE, removal of material comes as a combined result of chemical reactions and physical impact. Generally, the ions are accelerated by a voltage applied in a vacuum. The effect of their impact is aided by the introduction of a chemical which reacts with the surface being etched. In other words the reaction attacks and removes the exposed surface layers of the material being etched.

An RIE process advantageously permits very accurate etching of the one or more layers with little appreciable affect upon other layers. In other words, specific selection of different materials permits an RIE process to soften one layer without significantly softening another. In at least one embodiment, the removal or etching of the plurality of thin film layers 202 is accomplished with RIE. Although ion etching and RIE have been described in conjunction with at least one embodiment, it is understood and appreciated that one of ordinary skill in the art will recognize that a variety of different etch processes could be utilized without departing from the scope and spirit herein disclosed.

Figure 7:
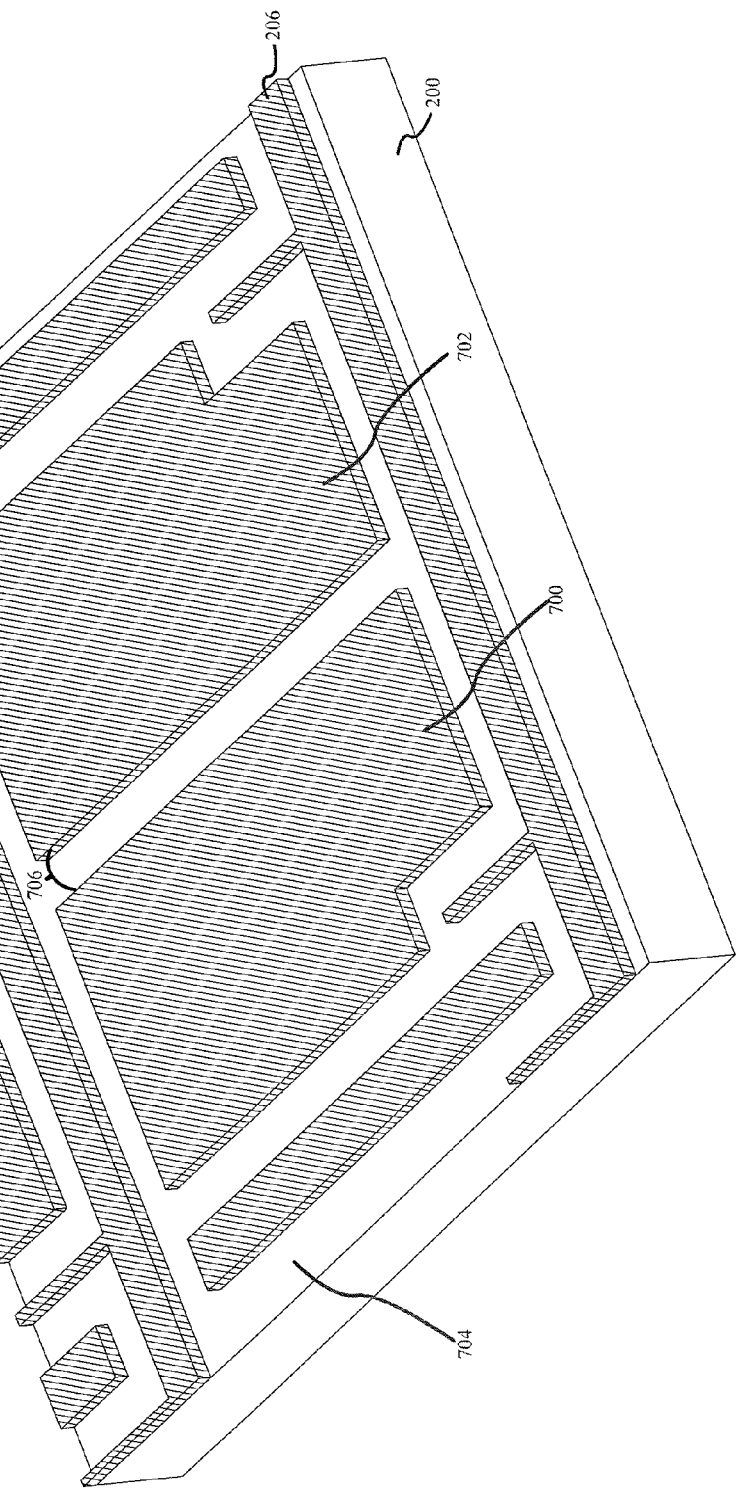
FIG. 7 is a partial perspective view showing only the bottom thin film layer of the structure in FIG. 6 showing the plurality of simply connected regions provided by the undercutting process in accordance with an embodiment.

So as to provide device isolation, an undercutting process is also performed upon at least one thin film device layer. This undercutting provides at least one bridge island. More specifically, as shown in FIG. 7, in at least one embodiment, it is the first metal layer 206 that is undercut.

For the creation of transistors, such as the paired thin-film transistors (hereinafter "TFTs") utilized in at least one embodiment of the pressure switch thin film device, the undercutting process also allows the source/drain to gate capacitance to be minimized thereby enabling high speed operation of the transistor and minimizing the feed through voltage that can degrade the performance of display applications.

To accomplish the undercutting, the etchant is preferably highly selective to the material of the thin film layer being undercut. It is for this reason that the composition of the first metal layer 206 is selected to be different from the composition of the second metal layer 208. It is also important that the etch process is isotropic since lateral etching of the film to be undercut is desired. Wet or dry isotropic etches can be used.

In at least one embodiment, the first metal layer 206 comprises chrome and the second metal layer 208 comprises aluminum. By utilizing an etchant that is highly selective to first metal layer 206 and not second metal layer 208, first metal layer 206 may be undercut without significant degradation to second metal layer 208, or the other thin film layers.

Figure 8:
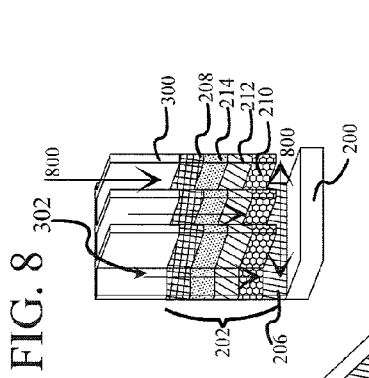
FIG. 8 is a partial detail perspective of FIG. 4 illustrating the undercutting etching process that results in the simply connected regions shown in FIG. 7 provided in the bottom layer in accordance with at least one embodiment.

As shown in FIG. 8 the isotropic etching process indicated by arrows 800 is continued upon the bottom layer, shown as first metal layer 206, to expose the substrate 200. As is appreciated in FIG. 7 this results in a plurality of simply connected regions, of which 700 and 702 are exemplary, which are otherwise isolated from other portions of first metal layer 206 by physical void 704. Indeed, physical void 704 includes a physical gap 706 that lies directly between simply connected regions 700 and 702.

It is understood and appreciated that in the example embodiment herein described and illustrated, dielectric layer 210 has not been undercut and therefore provides a single simply connected region adjacent to the plurality of simply connected regions 700 and 702 now present in the first metal layer 206 physical connection between the dielectric layer 210 vertically above the simply connected regions 700 and 702.

The single simply connected region of the dielectric layer 210, as well as that of semiconductor 212, contact layer 214 and second metal layer 208 bridge over many locations of physical void 704 that serves to isolate the plurality of simply connected regions 700 and 702 now provided in first metal layer 206. Moreover, simply connected regions 700 and 702 are bridge islands that will form the source/drain paired electrical contacts of the developing paired transistors.

It is of course realized that for the undercutting process to be effective there is preferably a significant difference in width between the width of the first metal layer 206 lines in the area desired to be etched through and the narrowest first metal layer 206 lines in the area desired to remain continuous. 3D template structure 300 and feature 302 define these areas.

Further, feature 302 provides the etchant to the first metal layer 206 in the specific area desired for undercutting. It is once again understood and appreciated that the scale of features 302 has been exaggerated with respect to other features of the 3D template structure 300 for purposes of illustration and discussion. For example the region of 3D template structure 300 defining the gate and channel area is likely quite different in scale from that shown.

A reasonable width to be cut through in first metal layer 206 with the undercutting process is about 1~3 microns, i.e., 0.5~1.5 micron from each side. The minimum feature width for features to remain in first metal layer 206 should be at least 4~6 microns. This undercutting process advantageously permits the plurality of thin film layers 202 that were initially deposited in succession without intervening masking, etching, or other reforming processes to now provide at least one cross over.

Further, it shall also be noted that for a bottom gate TFT, initial deposit of thin film layers 202 does not restrict the minimum channel length of the device. Channel length is an important factor in determining TFT performance. Minimum channel length is only limited by imprint resolution. The imprinting process described above advantageously permits the fabrication of channel lengths less than one micron.

Although the undercutting process has been described in this example to provide simply connected regions 700 and 702, it will be understood and appreciated by those skilled in the art that the undercutting process may also be employed to provide a released structure. Such a released structure may be desired in a TFD such as an accelerometer or other microelectromechanical system device, commonly referred to as MEMS.

Figure 9:
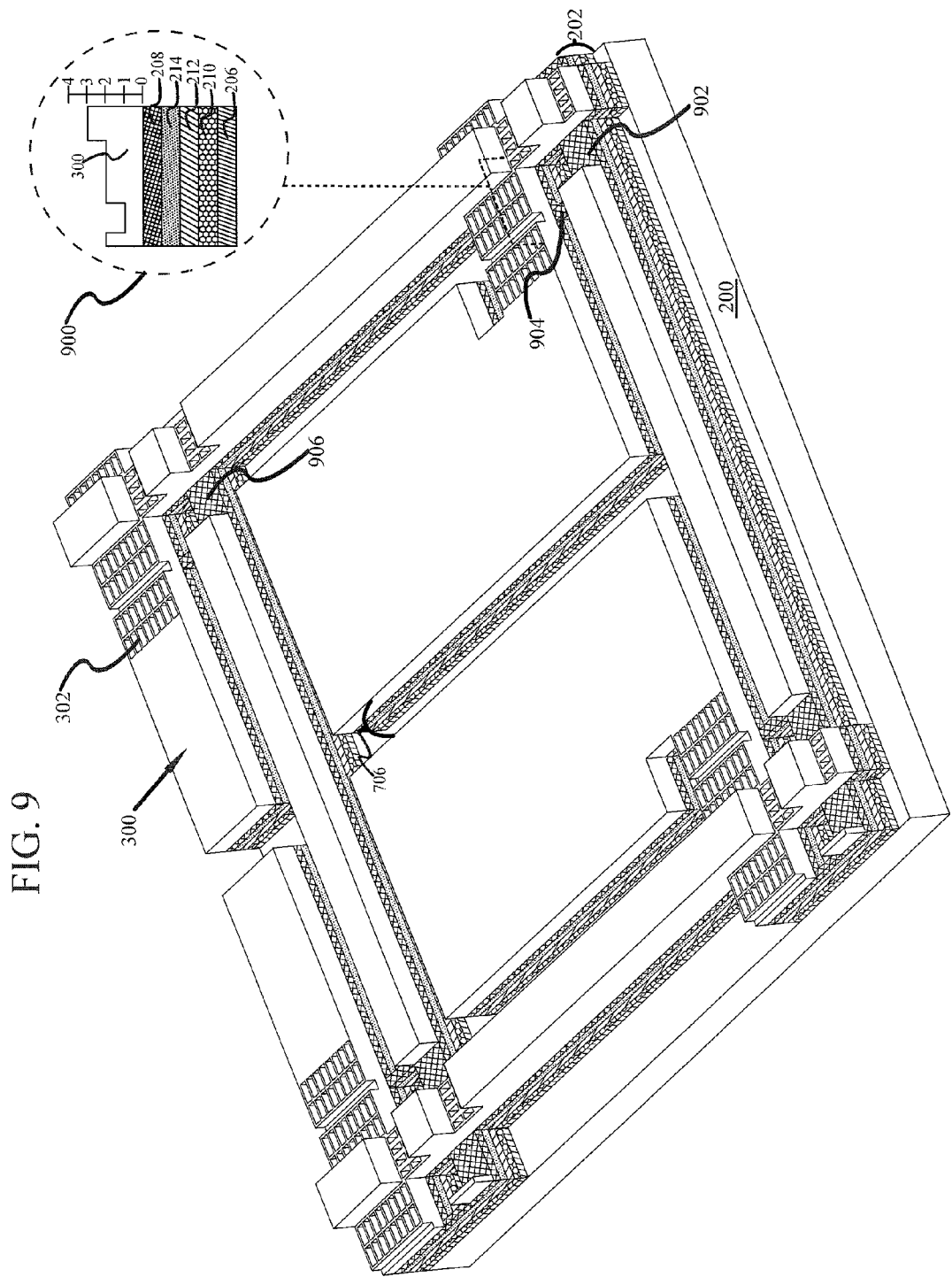
FIG. 9 is a perspective view of the structure in FIG. 6 with the 3D template having been etched to remove the thinnest layer and expose a portion of the top thin film layer in accordance with an embodiment.

As shown in FIG. 9, in at least one embodiment, following the undercutting process, the imprinted 3D template structure 300 is etched to expose the thin films beneath the thinnest remaining portion of the imprinted mask, level 1. As may be more clearly appreciated in the cross section view bounded by dotted line 900, levels 2, 3 and 4 have each been reduced by a unit of height.

In others words the 3D template structure 300 is etched to lower the overall height sufficient to remove the lowest vertical height (e g., original material at level 1). This etch exposes at least a portion of the stacked thin film layers 202 as representative areas 902, 904 and 906 indicate. The remaining portions of 3D template structure 300 have also been reduced.

Figure 10:
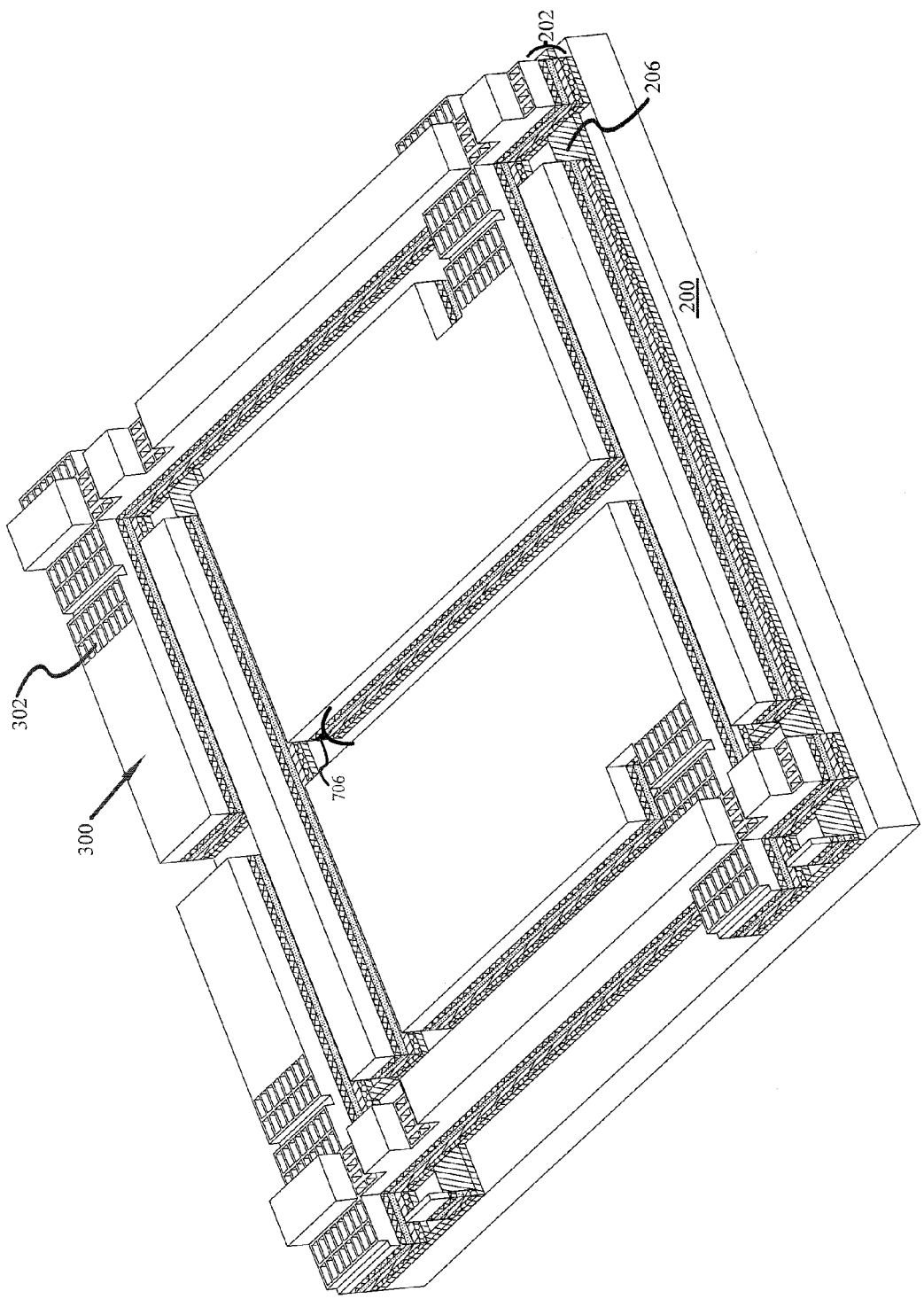
FIG. 10 is a perspective view of the structure in FIG. 9 with the exposed portions of the thin film layers etched to expose the bottom thin film layer in accordance with an embodiment.

Etching is now performed upon the exposed portions of the stacked thin film layers 202 to expose first metal layer 206. In at least one embodiment this etching is performed with highly selective etchants. In addition the etching process is anisotropic. The resulting structure with exposed first metal layer 206 is shown in FIG. 10

Figure 11:
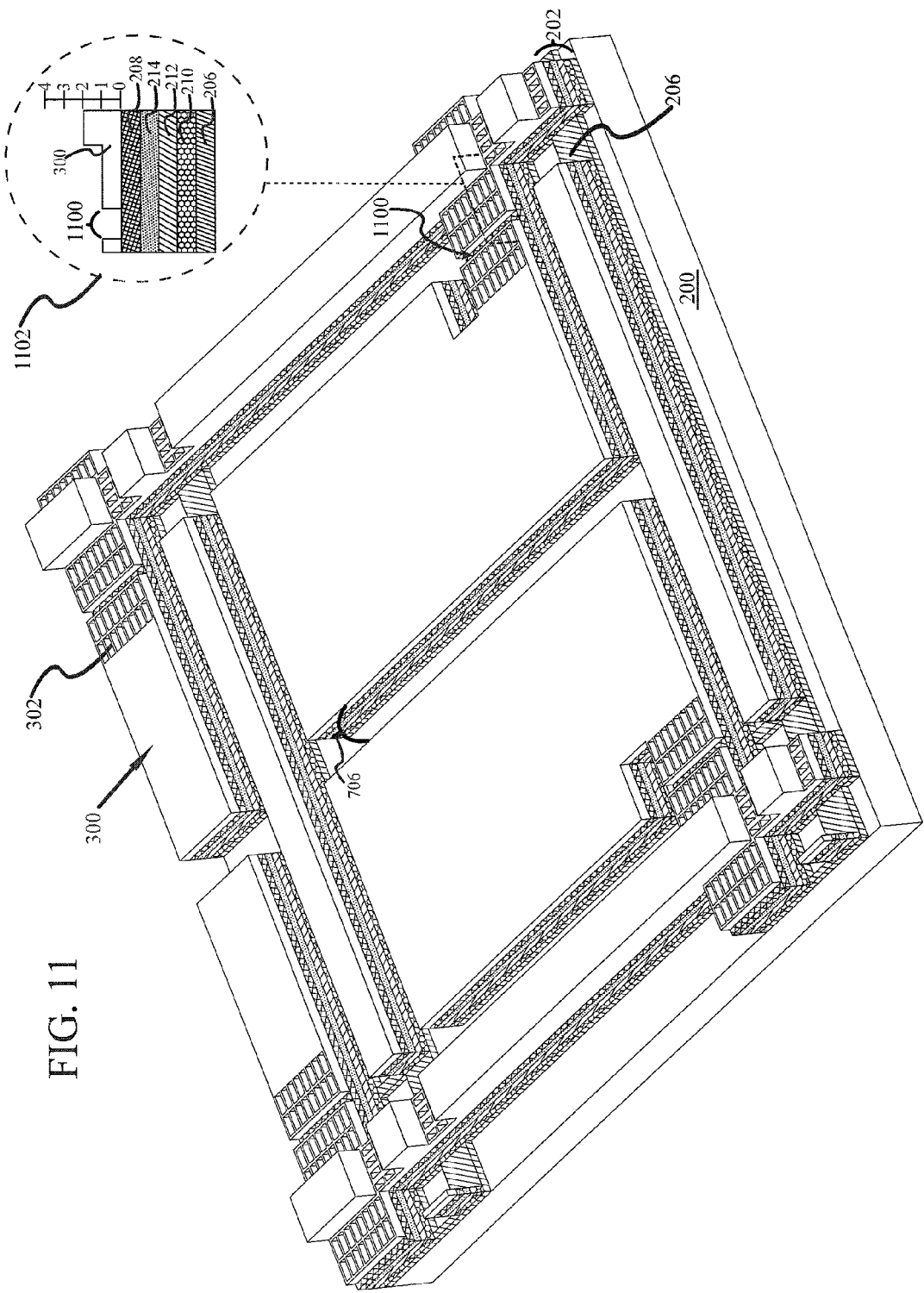
FIG. 11 is a perspective view of the structure in FIG. 10 with the 3D template having been etched to remove the thinnest layer and expose a portion of the top thin film layer in accordance with an embodiment.

As shown in FIG. 11, the imprinted 3D template structure 300 is etched again to remove the lowest vertical height, now level 2, Etching through the lowest remaining vertical height exposes at least a portion of the stacked thin film layers 202. The remaining portions of 3D template structure 300 have also been reduced in height. A narrow channel 1100 in 3D template structure 300 now exposes second metal layer 208, as the exposed portion of the thin film layers 202. A cross section view bounded by dotted line 1102 in FIG. 11 illustrates the side view of the center structure and further illustrates the respective remaining height levels 3 and 4 of 3D template structure 300 as being again reduced by a unit of height.

The second metal layer 208 as exposed through channel 1100 is now etched through to expose a sub layer. Specifically, in the embodiment shown, second metal layer 208 is etched through as is the contact layer 214 so as to expose the semiconductor layer 212. This etching process is preferably highly anisotropic so that the exposed portion of second metal layer 208 is removed while portions of second metal layer 208 remaining beneath 3D template structure 300 remain substantially intact. In at least one embodiment, this is also aided by the fact that the thickness of the second metal layer 208 is about $\frac{1}{10}$th the thickness of the thin metal regions adjacent to the aperture provided features 302.

Figure 12:
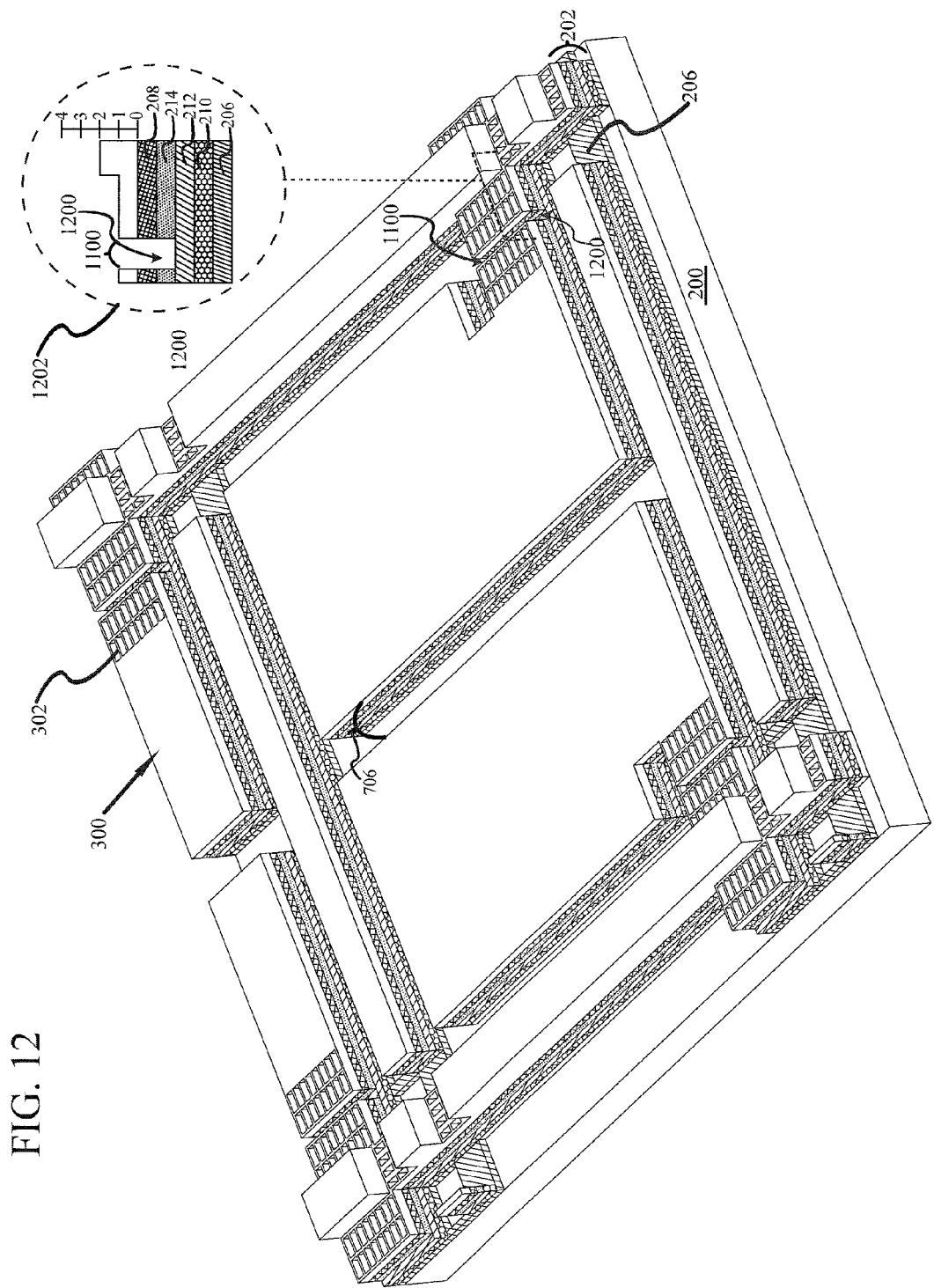
FIG. 12 is a perspective view of the structure in FIG. 11 with a channel now etched through the top exposed thin film layer in accordance with an embodiment.

For the exemplary embodiment herein described, FIG. 12 illustrates the exposed semiconductor layer 212 in channel 1100. This etching to expose semiconductor layer 212 establishes the channel 1200 for developing transistors. A cross section view bounded by dotted line 1202 illustrates the side view of the center structure and further illustrates the respective height levels of 3D template structure 300 and channel 1200.

Figure 13:
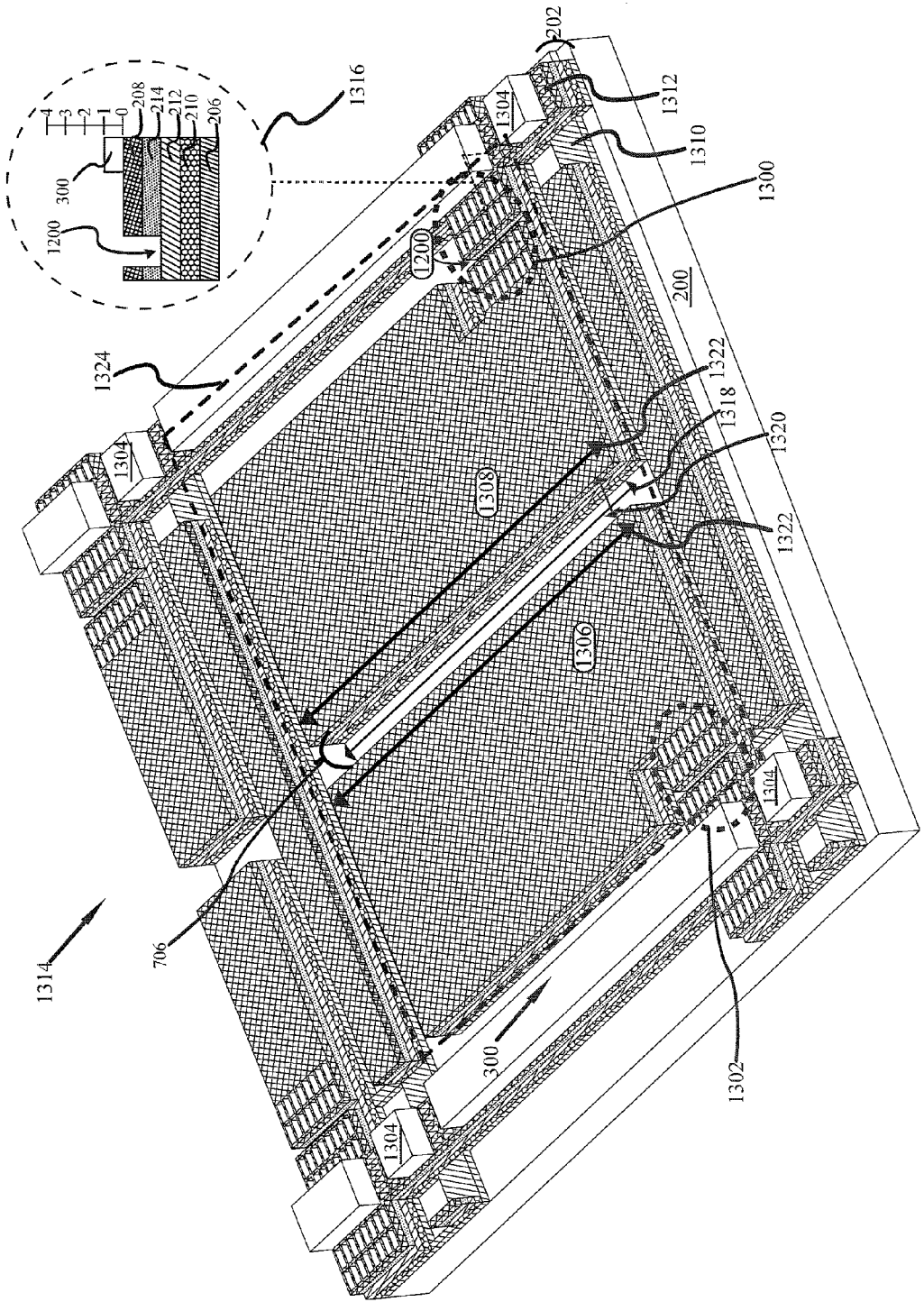
FIG. 13 is a perspective view of the structure in FIG. 12 with the 3D template having been etched to remove the thinnest layer and expose portions of the top thin film and expose a plurality of electrical contact pairs, the remaining portions of the 3D template providing aligned spacer posts adjacent to the electrical contact pairs in accordance with an embodiment.

As shown in FIG. 13, the lowest portion of 3D template structure 300 (what was initially height 3) has been etched through to expose the formed electrical contact pads (e.g., the source/drain contacts) of paired bottom gate transistors 1300 and 1302. The remaining portions of 3D template structure 300 (what was initially height 4) now provide spacer posts 1304 adjacent to the exposed paired electrical contacts 1306 and 1308 of transistors 1300 and 1302.

Moreover, the first metal layer 206 provides gate contacts 1310, and second metal layer 208 provides source contacts 1312 and drain contacts, corresponding to electrical contacts 1306 and 1308. More specifically, paired bottom-gate TFT 1300 and 1302 are 3D contoured structures providing at least 4 substantially different vertical heights. The gate contacts 1310 are provided proximate to the substrate at the lowest height. The channel 1200 is provided proximate to the intermediate height. The source contacts 1312 and drain 1306, 1308 are provided above the channel 1200, and aligned spacer posts 1304 are provided at the highest level.

With respect to the above description, it is understood and appreciated that the alignment of these elements is inherently established at the outset of fabrication and remains unchanged. Though distortion may occur in roll-to-roll processing, the distortion is relative to all elements such that spacer posts 1304 remain properly positioned with respect to electrical contacts 1306 and 1308. Moreover, the resulting structure is an active matrix 1314. A cross section view bounded by dotted line 1316 in FIG. 13 further illustrates the remaining portion of 3D template structure 300 as well as channel 1200.

Physical gap 706 separates electrical contacts 1306 and 1308. Moreover the gap has a depth, a length 1318 and a width 1320. Each electrical contact 1306 and 1308 has a first dimension (e.g., a length 1322) substantially parallel to the gap length 1318. With respect to the notion of an active matrix, the paired electrical contacts 1306 and 1308 TFT 1300 and 1302 define a pixel as indicated by dotted line 1324. The pixel to pixel spacing may of course be varied depending on application, however each pixel 1324 defines the size and location of the functional pressure switch.

Figure 14:
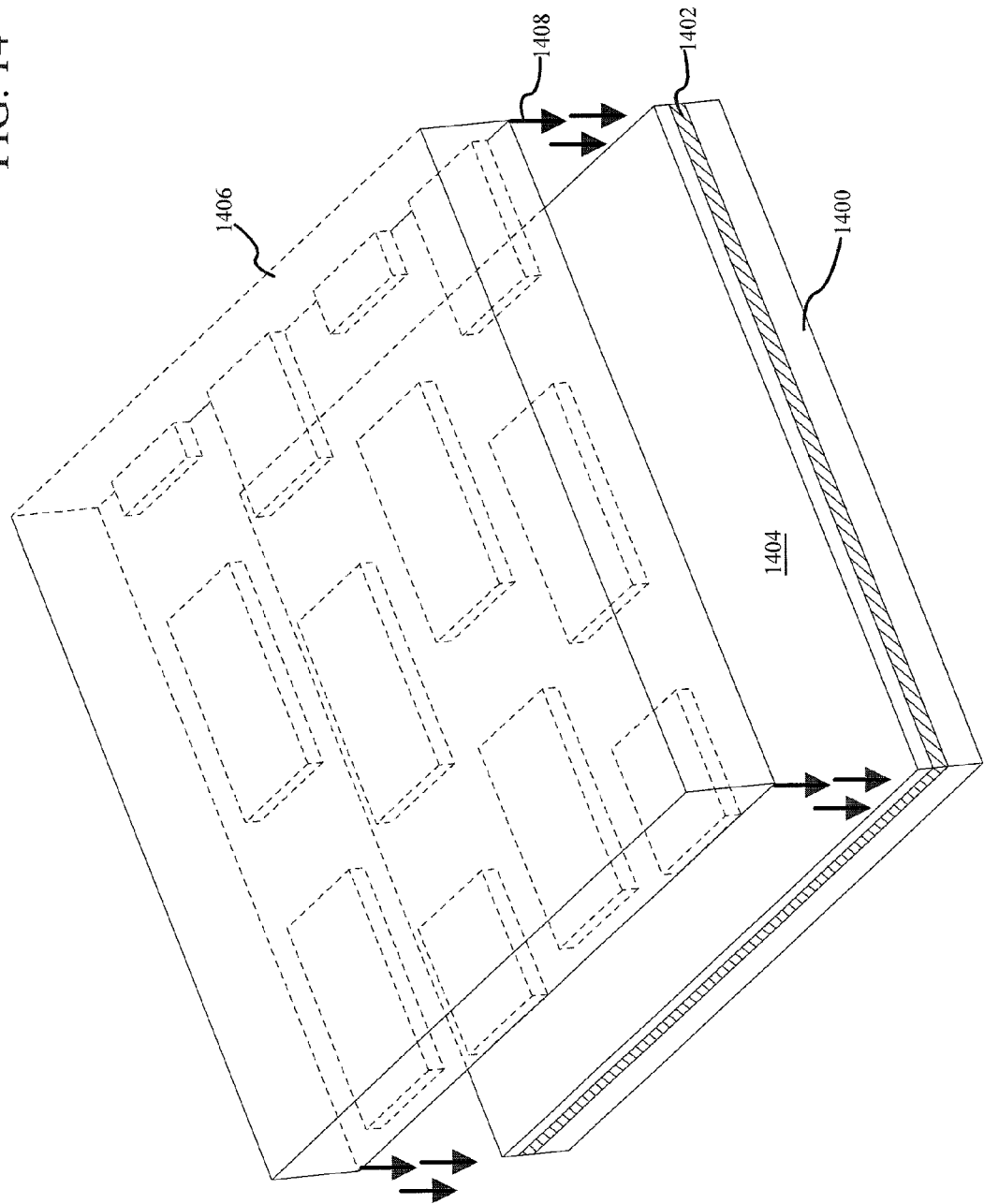
FIG. 14 is a perspective view of a second substrate with at least one conductive film layer and a polymer set to receive a stamping template in accordance with an embodiment.
Figure 15:
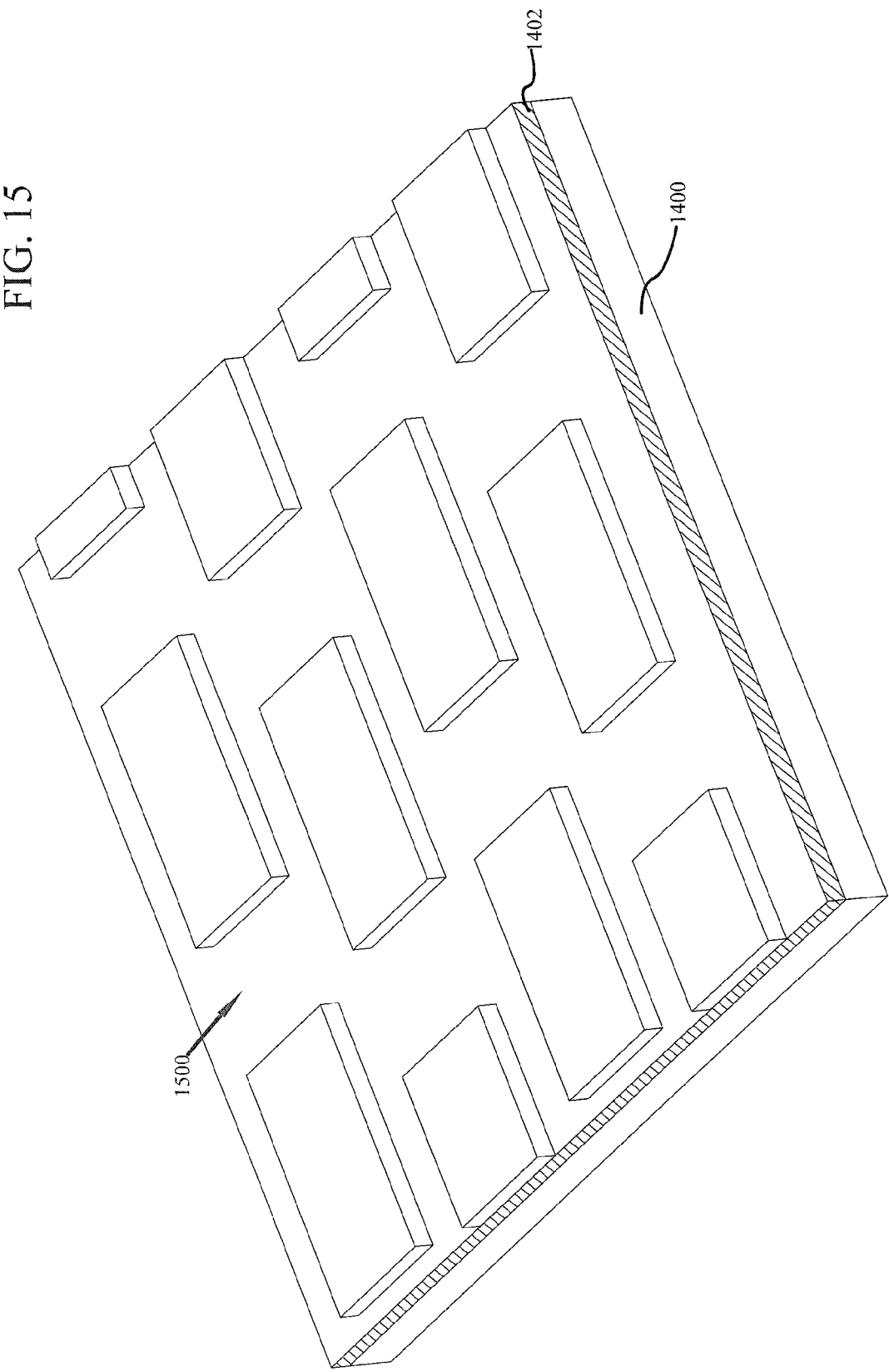
FIG. 15 is a perspective view of the formed 3D polymer template resulting from the imprinting as shown in FIG. 14 in accordance with an embodiment.
Figure 16:
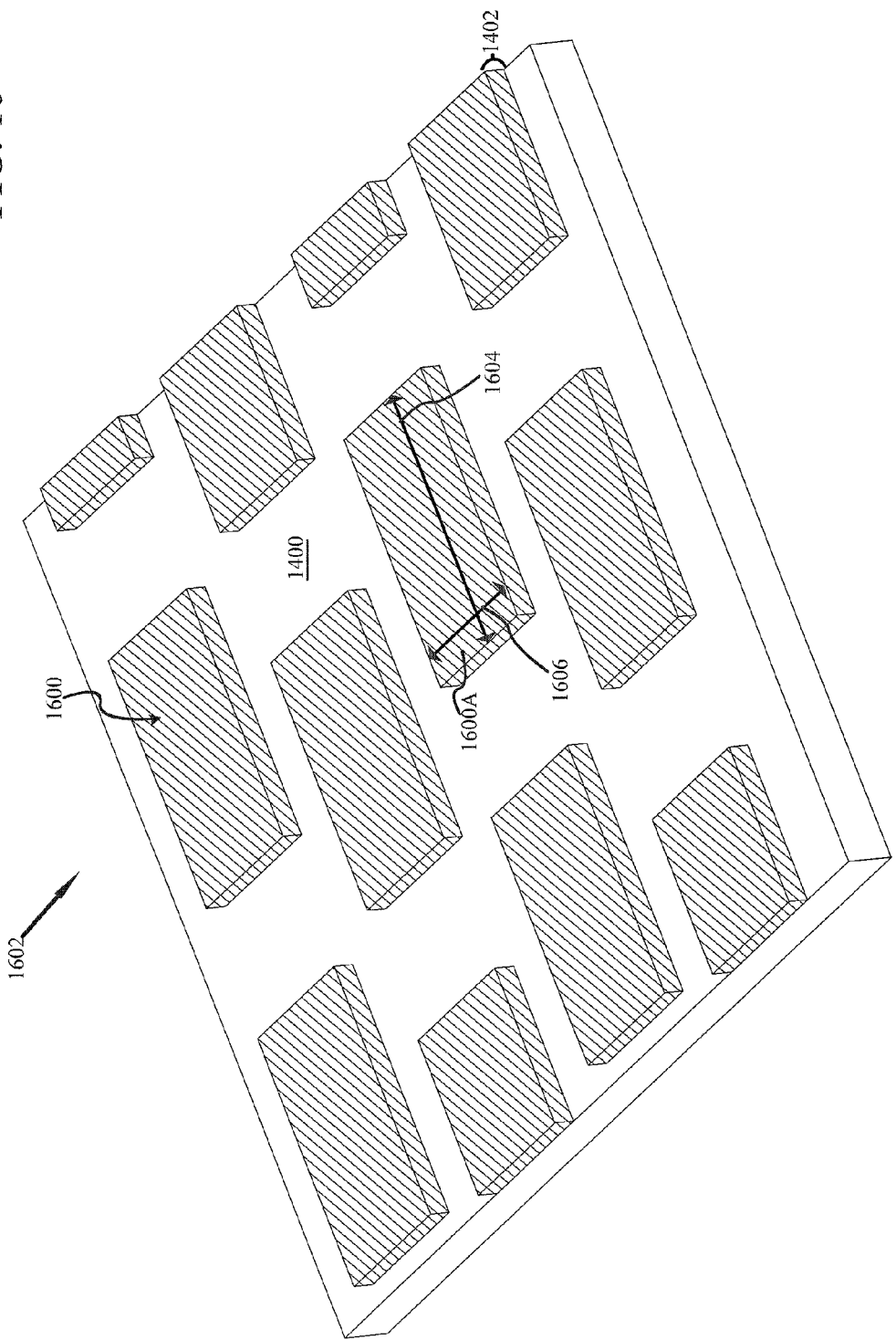
FIG. 16 is a perspective view of the resulting conductive contacts established from etching the conductive layer as indicated by the 3D template in FIG. 15 in accordance with an embodiment.

With the active matrix 1314 component now established a flexible membrane having a plurality of separate electrical contacts overlapping the contact pairs 1306 and 1308 is provided and disposed upon the active matrix 1314. Spacer posts 1304 provide a gap between the electrical contacts and the contact pairs. FIGS. 14~16 provide at least one method of providing such a flexible membrane in accordance with at least one embodiment.

FIG. 14 shows a portion of a flexible membrane, otherwise also referred to as a flexible substrate 1400. In at least one embodiment, the flexible substrate 1400 is both flexible and transparent. Typically, the flexible substrate 1400 is chemically cleaned to remove any particulate matter, organic, ionic, and or metallic impurities or debris which may be present upon the surface of the substrate. In at least one embodiment an appropriate flexible substrate 1400 is selected as one that under application of about 0.01 MPa will deflect sufficiently over the distance of the pixel spacing 1324 so as to permit contact with the paired electrical contacts 1306 and 1308 as further described below. In at least one embodiment, flexible substrate 1400 is silicone rubber.

At least one layer of conductive material 1402 is deposited upon the substrate. Deposition of the conductive material layer 1402 may be done by vacuum deposition, gravure coating, or such other method as is appropriate for the material being deposited and/or the TFD being formed.

To provide a template for forming a plurality of electrical contacts, in at least one embodiment it is desirable to have a 3D template structure over the conductive material layer 1402. In at least one embodiment, a polymer 1404, such as an imprint polymer or imprint resist, is deposited upon the conducive material layer 1402. This resist or polymer 1404 may comprise any of a variety of commercially available polymers. For example, a polymer from the Norland optical adhesives (NOA) family of polymers could be used. A silicone material may also be used as is described in patent application Ser. No. 10/641,213 entitled "A Silicone Elastomer Material for High-Resolution Lithography" which is herein incorporated by reference.

The stamping tool 1406, though shown as a block, is in at least one embodiment provided by a stamping roller. In at least one embodiment this is a seamless imprinting roller as set forth and described in U.S. patent application Ser. No. 11/688,086 filed on Mar. 19, 2007 and entitled "Seamless Imprint Roller And Method of Making," noted above and incorporated by reference. With further respect to roll-to-roll processing where flexible substrate 1400 may be of arbitrary size, yet another method for providing a 3D Structure is described in U.S. Pat. No. 6,808,646 entitled "Method of Replicating a High Resolution Three-Dimension Imprint Pattern on a Compliant Media of Arbitrary Size" which is also herein incorporated by reference.

As illustrated by arrows 1408, stamping tool 1406 is brought into intimate contact with polymer 1404 with sufficient force to imprint polymer 1404 and establish a 3D template structure. In at least one embodiment, capillary forces are used to draw the imprint polymer 1404 into the stamping tool 1406, thus permitting very low contact pressure. Stamping tool 1406 may be translucent such that the stamped polymer may be hardened or otherwise cured, such as by UV light, to retain the 3D template structure.

FIG. 15 illustrates the resulting 3D template structure 1500. For the purpose of establishing the plurality of electrical contacts upon the flexible substrate 1400, in at least one embodiment the 3D template structure provides simple features having only one raised elevation. It is of course understood and appreciated that as described above, the 3D template structure 1500 may in certain embodiments provide a template structure having a plurality of different elevations.

An etching process is performed substantially as discussed and described above with respect to FIG. 4, with FIG. 16 illustrating the resulting plurality of separate electrical contacts 1600, of which electrical contacts 1600A is exemplary. Moreover, the results of the etching process flexible membrane structure 1602.

In at least one embodiment, the separate electrical contacts are presented in a staggered arrangement. Each of the separate electrical contacts, such as, for example, electrical contact 1600A has a width dimension 1604 and a length dimension 1606. In at least one embodiment, the length dimension 1604 is greater than the gap width 1320 (see FIG. 13) and the width dimension 1606 is less than the electrical contact length 1322 (see FIG. 13). The relationship of these dimensions is further illustrated in FIG. 18.

Figure 17:
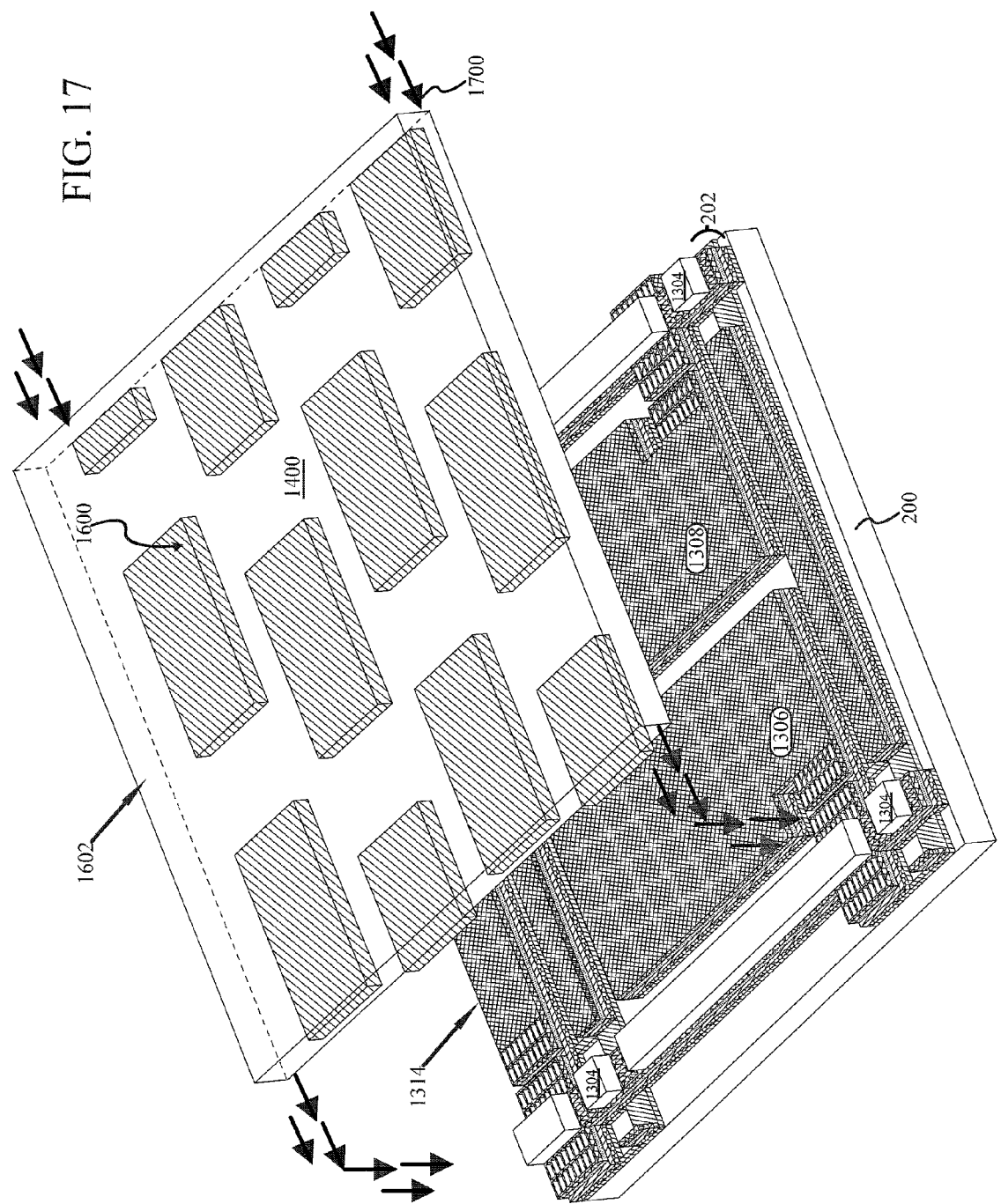
FIG. 17 is a perspective view of the structure of FIG. 16 being aligned with the structure of FIG. 13 in accordance with an embodiment.

As shown in FIG. 17, the flexible membrane structure 1602 is oriented to present the plurality of separate electrical contacts 1600 towards the active matrix 1314. As is indicated by arrows 1700, the flexible membrane structure 1602 and active matrix 1314 are brought together.

Figure 18:
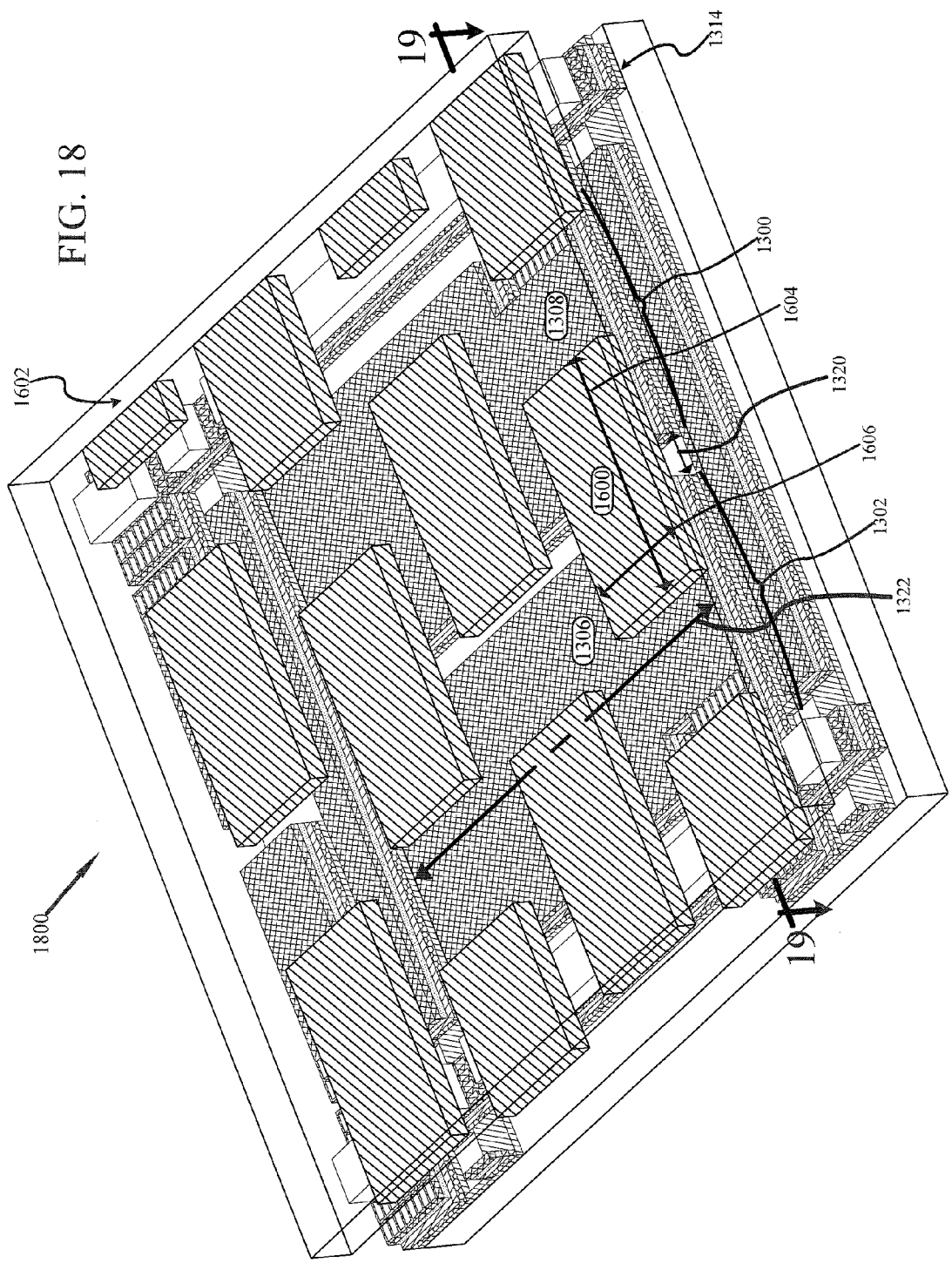
FIG. 18 is a perspective view of the assembled structure of FIG. 17 providing a pressure switch thin film device in accordance with an embodiment.

FIG. 18 presents the assembled pressure switch thin film device 1800. In at least one embodiment, the pressure switch thin film device 1800 is fabricated in accordance with the above described method. As is also shown, the relationship of the length 1604 and width 1606 of electrical contact 1600 with respect to the length 1322 of the electrical contacts 1306, 1308 and the width 1320 of physical gap 706 is also illustrated. In at least one embodiment the electrical contacts 1600 are of substantially equal size and shape.

As FIGS. 14-18 show partial perspective views, it is understood and appreciated that in some cases only portions of an electrical contact 1600 may be shown. In at least one alternative embodiment, the electrical contacts may be of varying size. In further addition, although shown to be generally rectangular, it is understood and appreciated that the electrical contacts 1600 may be provided in other geometric forms as well.

FIG. 19 provides a cut through of the assembled pressure switch thin film device 1800 as shown in FIG. 18. The alignment of the thin film layers 202 and specifically the undercut portions of first metal layer 206 are also shown, as is the alignment of the channel 1200 and gate conductor 1310.

FIG. 19 also illustrates that the flexible membrane 1602 has a first relaxed position 1900. In this first relaxed position 1900 it is appreciated that a physical gap 1902 exists and separates electrical contact 1600 from physically contacting either paired electrical contacts 1306 or 1308. This gap 1902 is provided by the spacer posts 1304 displacing the flexible membrane 1602 from the electrical contacts 1306 and 1308 of active matrix 1314.

When a force is applied, as indicated by arrows 1904, such as by a fingertip 1906, the flexible membrane 1602 distorts from the first relaxed position 1900 to a second deformed position 1908. The deformation is localized to the areas where the force 1904 is applied. As shown, the deformation is sufficient to place electrical contact 1600 in physical contact as a bridge between electrical contacts 1306 and 1308.

When the pressure is removed, the flexible membrane 1602 will return to the first relaxed state 1900 and the contact between electrical contact 1600 and electrical contacts 1306 and 1308 will cease. It is also understood and appreciated, that as flexible membrane 1602 provides a plurality of separate, short and redundant electrical contacts 1600 rather than continuous strips of contacts (powered or un-powered), the yield of the contacts 1600 upon the flexible membrane can be much higher than devices requiring continuous electrodes that subtend the entire array width. In addition, the failure of one or even several electrical contacts 1600 due to movement stress is unlikely. However, even in the event of such failure the overall functionality of the flexible membrane 1602 is substantially unaffected. This is highly advantageous over devices requiring continuous electrodes, the loss or damage of one or more significantly affecting the operation of the device.

Moreover, this operation yields the pressure switch which permits operation of the pressure switch thin film device 1800. When electrical contact 1600 bridges between electrical contacts 1306 and 1308 current is permitted to flow between electrical contacts 1306 and 1308 by way of electrical contact 1600.

FIG. 20 illustrates at least two different circuit embodiments that employ the pressure switch thin film device 1800. In the first, each pixel 1324 has two data lines: 2000A, 2002A for pixel 1324A; and 2000B, 2002B for pixel 1324B. In this first circuit, when the switch is closed by depressing the flexible membrane 1602, the signal will propagate from the first TFT through the second TFT (e.g., from TFT 1300 to TFT 1302) of the pixel 1324A where the current flowing can be measured through a transconduction amplifier or even with a resistor used as a current shunt.

In the second circuit embodiment, the pixels 1324A, 1324B share datalines, e.g., 2004. In this case, each pixel 1324A, 1324B shares voltage drive lines 2004 and current sense lines 2006 with its neighbors. In at least one embodiment employing the shared circuit design, half the resolution in the device is lost, but the device has greater redundancy. For example, if multiple level detection is used then the resolution can be enhanced at the cost of greater processing (providing a greater density of pixels 1324). In such a setting, if the current is 1 unit, then only one of the switches is closed, i.e., 1324A or 1324B. If both pixels 1324A and 1324B are closed then twice the current will flow. It is understood and appreciated that other circuit arrangements may also be architected to employ the pressure switch thin film device 1800.

The arrangement of the elements as shown and described is not arbitrary. If gate contacts 1310 are highly exposed in the pixel 1324A, 1324B, shorting from the actuated conductor 1600 might inadvertently occur. Therefore, gate contacts 1300 are arranged to occur on the edge of the array as shown, rather than inside the pixel 1324A, 1324B.

Although illustrated with respect to a single paired set of bottom-gate transistors, it will be understood and appreciated that the above described processes may be performed substantially simultaneously across a large substrate to provide a plurality of paired bottom-gate TFTs in a large matrix array. In larger form, the resulting pressure switch thin film device 1800 may be suitable not only for fingerprint recognition but entire hand print recognition. In addition, the pressure switch thin film device 1800 may be employed to detect feature differentiation in materials such as but not limited to, documents, cards, the surface of fruit, or other such materials that have surfaces with varying features.

In at least one embodiment, it is possible to achieve transparent or semi-transparent pressure switch thin film device 1800 via the use of Indium Tin Oxide, one of the known few transparent conductive materials. Other transparent conductive and semiconductor materials may also be used such as, for example, ZnO as well as certain organic and doped semiconductor materials. Transparent dielectrics, such as, for example, SiN or $AL_2O_3$ may also be used.

Depending upon the thickness of the etched thin film layers 202 (the top and bottom conductors in materials therebetween) and the size of the resulting electrical contacts 1306 and 1308 of the active matrix 1314 and the separate electrical contacts 1600 of the flexible membrane 1602, to some extent, pressure switch thin film devices 1800 made with common materials such as Al, Au, Cu, Si SiN, Cr, or the like may also be used to provide the components of the active matrix 1314 and flexible membrane 1602 of sufficiently small and thin size so as not to be visually obvious or intrusive. In other words the structures may be designed to have small enough thicknesses and small enough widths and intervening aperture spacing between components that they are either nearly transparent and/or the loss of light due to absorption is minimal.

Changes may be made in the above methods, systems and structures without departing from the scope thereof. It should thus be noted that the matter contained in the above description and/or shown in the accompanying drawings should be interpreted as illustrative and not in a limiting sense. The following claims address all generic and specific features described herein, as well as all statements of the scope of the present method, system and structure, which, as a matter of language, might be said to fall therebetween.

What is claimed is:

1. A method of forming a pressure switch thin film device comprising:
   providing a substrate;
   depositing a plurality of thin film device layers upon the substrate;
   providing a 3D template structure upon the plurality of thin film device layers, the 3D template providing patterning and alignment for subsequent etchings and undercutting;
   etching the plurality of thin film device layers and 3D template structure to define a plurality of aligned electrical contact pairs and adjacent spacer posts;
   undercutting at least one thin film device layer to provide an active matrix;
   depositing a flexible membrane upon the active matrix, the membrane providing a plurality of separate electrical contacts overlapping the contact pairs, the spacer posts providing a gap between the electrical contacts and the contact pairs.

2. The method of claim 1, wherein the substrate is suitable for roll-to-roll processing.

3. The method of claim 1, wherein providing the 3D template is produced with a single polymer imprinting process.

4. The method of claim 1, wherein the 3D template is a non-conductive material.

5. The method of claim 1, wherein the flexible membrane is elastic, having a first relaxed position, and a second deformed position in a localized area when an external force is applied to the localized area, the membrane returning to the first relaxed position when the external force is removed.

6. The method of claim 1, wherein each spacer post is aligned adjacent to at least one contact pair.

7. The method of claim 1, wherein the undercutting provides a plurality of simply connected regions in at least one thin film device layer adjacent to a single simply connected region in a different thin film device layer.

8. The method of claim 1, wherein the 3D template has at least 4 different vertical heights.

9. The method of claim 1 wherein each electrical contact pair is separated by a gap having a depth, a length and a width, each electrical contact having a first dimension parallel to the length, each separate electrical contact upon the flexible membrane having a width dimension greater than the gap width and a length dimension less than the electrical contact length, the separate electrical contacts staggered in arrangement upon the second flexible substrate.

10. A pressure switch thin film device fabricated in accordance with claim 1.

11. A method of forming a pressure switch thin film device comprising:
   providing a first flexible substrate;
   depositing a plurality of thin film device layers upon the first flexible substrate;
   depositing an imprint polymer upon the plurality of thin film device layers;
   forming a 3D template in the imprint polymer, the 3D template masking at least a portion of the thin film device layers; the 3D template having a plurality of different vertical heights;
   etching unmasked portions of the thin film device layers thereby exposing at least a portion of the first substrate and defining a plurality of aligned electrical contact pairs;
   undercutting at least one thin film device layer thereby providing a simply connected region beneath each electrical contact of the contact pair;
   etching the 3D template to provide at least one spacer post adjacent to each electrical contact pair;
   providing a second flexible substrate;
   depositing at least one conductive layer upon the second flexible substrate;
   patterning the conductive layer to provide a plurality of separate electrical contacts upon the second flexible substrate; and
   deposing the second flexible substrate with the plurality of electrical contacts upon the spacer posts, the separate electrical contacts oriented towards, overlapping and displaced above the contact pairs.

12. The method of claim 11, wherein the second flexible substrate is elastic, having a first relaxed position, and a second deformed position in a localized area when an external force is applied to the localized area, the second flexible substrate returning to the first relaxed position when the external force is removed.

13. The method of claim 11, wherein the 3D template is a non-conductive material.

14. The method of claim 11, wherein to form a transistor device, the 3D template has 4 different vertical heights.

15. The method of claim 11, wherein each electrical contact pair is separated by a gap having a depth, a length and a width, each electrical contact having a first dimension parallel to the length, each separate electrical contact upon the second flexible substrate having a width dimension greater than the gap width and a length dimension less than the electrical contact length, the separate electrical contacts staggered in arrangement upon the second flexible substrate.

16. The method of claim 11, wherein the method is performed as a roll-to-roll process.

17. A method of forming a pressure switch thin film device comprising:
   providing a substrate;
   depositing a plurality of stacked thin film device layers upon the substrate, the stack including a bottom layer and a top layer;
   depositing an imprint polymer upon the plurality of thin film device layers;
   forming a 3D template in the imprint polymer, the 3D template masking at least a portion of the thin film device layers, the 3D template having a plurality of different vertical heights;
   etching unmasked portions of the thin film device layers thereby exposing at least a portion of the substrate;
   undercutting the bottom layer thereby providing at least one bridge island pair;
   etching through the lowest vertical height thereby exposing at least a portion of the thin film layers;
   etching the exposed portion of the thin film layers thereby exposing the bottom layer; and
   etching through at least one remaining vertical height, thereby exposing at least a portion of the top layer as a contact disposed above each bridge island, thereby providing contact pairs, the etching further defining from the last vertical height at least one spacer post adjacent to each electrical contact pair;
   depositing a flexible membrane upon the active matrix, the membrane providing a plurality of separate electrical contacts overlapping the contact pairs, the spacer posts providing a gap between the electrical contacts and the contact pairs.

18. The method of claim 17, wherein disposing the flexible membrane includes:
   providing a second flexible substrate;
   depositing at least one conductive layer upon the second flexible substrate;
   patterning the conductive layer to provide a plurality of separate electrical contact upon the second flexible substrate; and
   deposing the second flexible substrate with the plurality of electrical contacts upon the spacer posts, the separate electrical contact oriented towards, overlapping and displaced above the contact pairs.

19. The method of claim 17, wherein the flexible membrane is elastic, having a first relaxed position, and a second deformed position in a localized area when an external force is applied to the localized area, the membrane returning to the first relaxed position when the external force is removed.

20. The method of claim 17, wherein the 3D template has 4 different vertical heights, the 3D template serving to define an active matrix of paired TFT transistors, the electrical contacts of the membrane electrically coupling a TFT pair when the membrane is physically depressed.

* * * * *